United States Patent
Suzuki

[11] Patent Number: 6,078,381
[45] Date of Patent: Jun. 20, 2000

[54] EXPOSURE METHOD AND APPARATUS

[75] Inventor: Kazuaki Suzuki, Kawasaki, Japan

[73] Assignee: Nikon Corporation, Tokyo, Japan

[21] Appl. No.: 08/662,519

[22] Filed: Jun. 13, 1996

Related U.S. Application Data

[63] Continuation-in-part of application No. 08/451,656, May 30, 1995, abandoned, which is a continuation of application No. 08/368,387, Dec. 30, 1994, abandoned, which is a continuation of application No. 08/187,553, Jan. 28, 1994, abandoned, and a continuation-in-part of application No. 08/622,920, Mar. 27, 1996, Pat. No. 5,591,958, which is a continuation of application No. 08/260,398, Jun. 14, 1994, abandoned.

[30] Foreign Application Priority Data

| Feb. 1, 1993 | [JP] | Japan | 5-014482 |
| Feb. 1, 1993 | [JP] | Japan | 5-014483 |
| Jun. 14, 1993 | [JP] | Japan | 5-141912 |
| Jun. 16, 1993 | [JP] | Japan | 5-144633 |

[51] Int. Cl.$^7$ .............................................. G03B 27/68
[52] U.S. Cl. ............................................. 355/53; 355/77
[58] Field of Search ............................ 355/53, 67, 77; 356/399, 400, 401; 250/548

[56] References Cited

U.S. PATENT DOCUMENTS

| 4,465,368 | 8/1984 | Matsuura et al. | 356/218 |
| 4,822,975 | 4/1989 | Torigoe | 219/121.85 |
| 4,956,789 | 9/1990 | Hamada et al. | 364/508 |
| 5,191,374 | 3/1993 | Hazama et al. | 355/43 |
| 5,243,377 | 9/1993 | Umatate et al. | 355/53 |
| 5,281,996 | 1/1994 | Bruning et al. | 355/77 |
| 5,343,270 | 12/1994 | Skakibara et al. | 355/53 |
| 5,361,121 | 11/1994 | Hattori et al. | 355/50 |
| 5,473,410 | 12/1995 | Nishi | 355/53 |
| 5,477,304 | 12/1995 | Nishi | 355/53 |
| 5,591,958 | 1/1997 | Nisihi et al. | 250/205 |

*Primary Examiner*—Georgia Epps
*Assistant Examiner*—Tim Thompson
*Attorney, Agent, or Firm*—Vorys, Sater, Seymour and Pease LLP

[57] ABSTRACT

An exposure apparatus for transferring a pattern formed on a mask to a photo-sensitive substrate is provided with an illumination optical system for illuminating a local area on the mask with a light beam, a projection optical system for projecting the pattern of the mask to the photosensitive substrate and a scanning device for scanning synchronously the mask and the photosensitive substrate, and a device for setting a width of an exposure area in a scan direction of the photosensitive substrate conjugate with an illumination area on the mask with respect to the projection optical system, to integer times as large as a distance which the photosensitive substrate moves during an interval between pulse emissions from the light source.

36 Claims, 20 Drawing Sheets

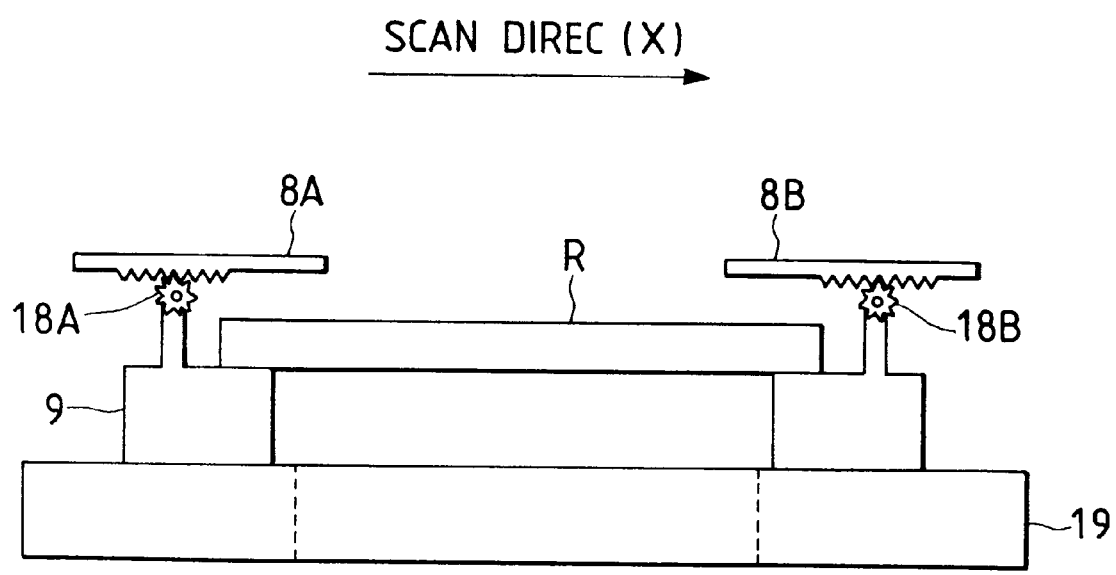

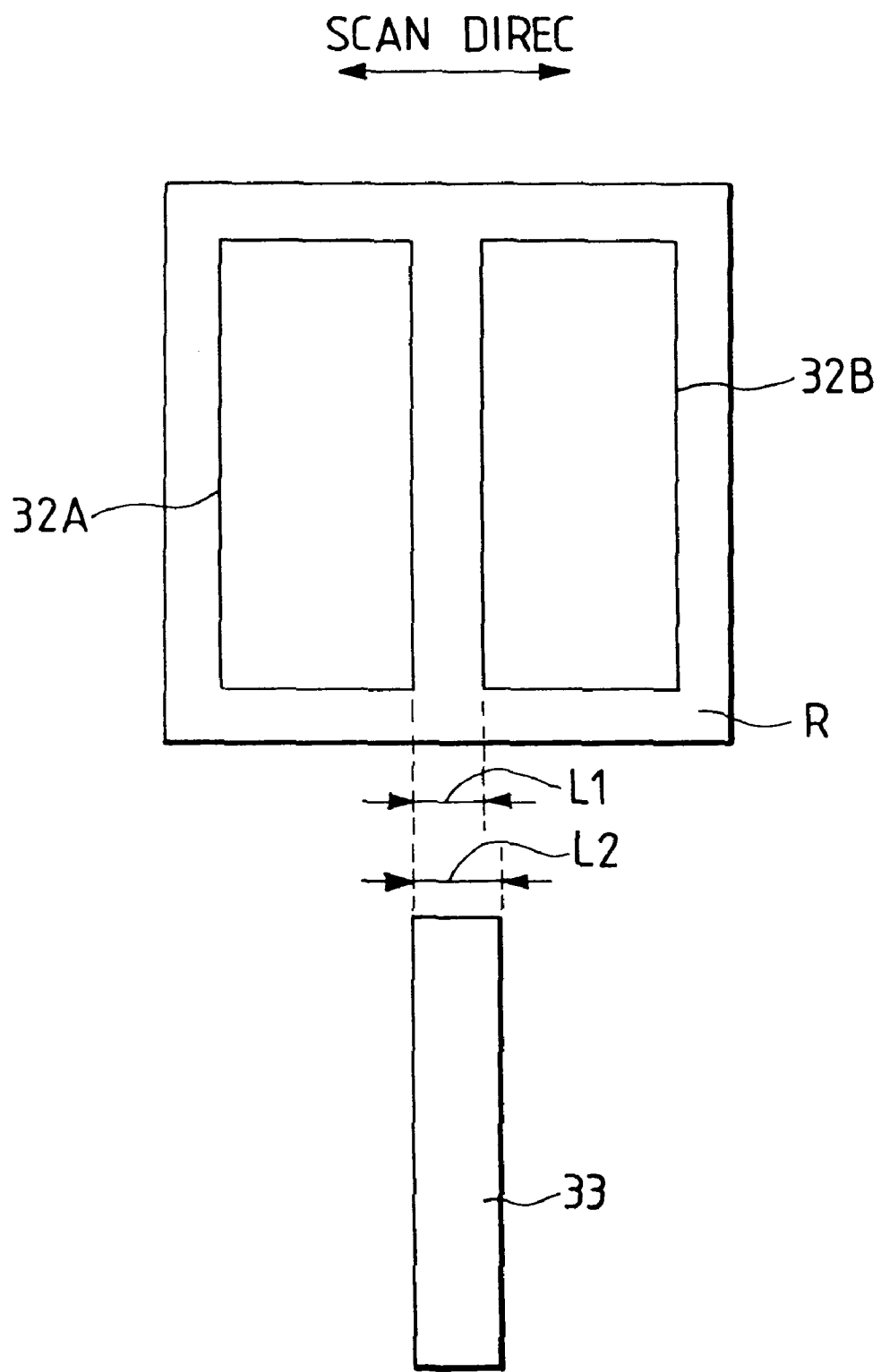

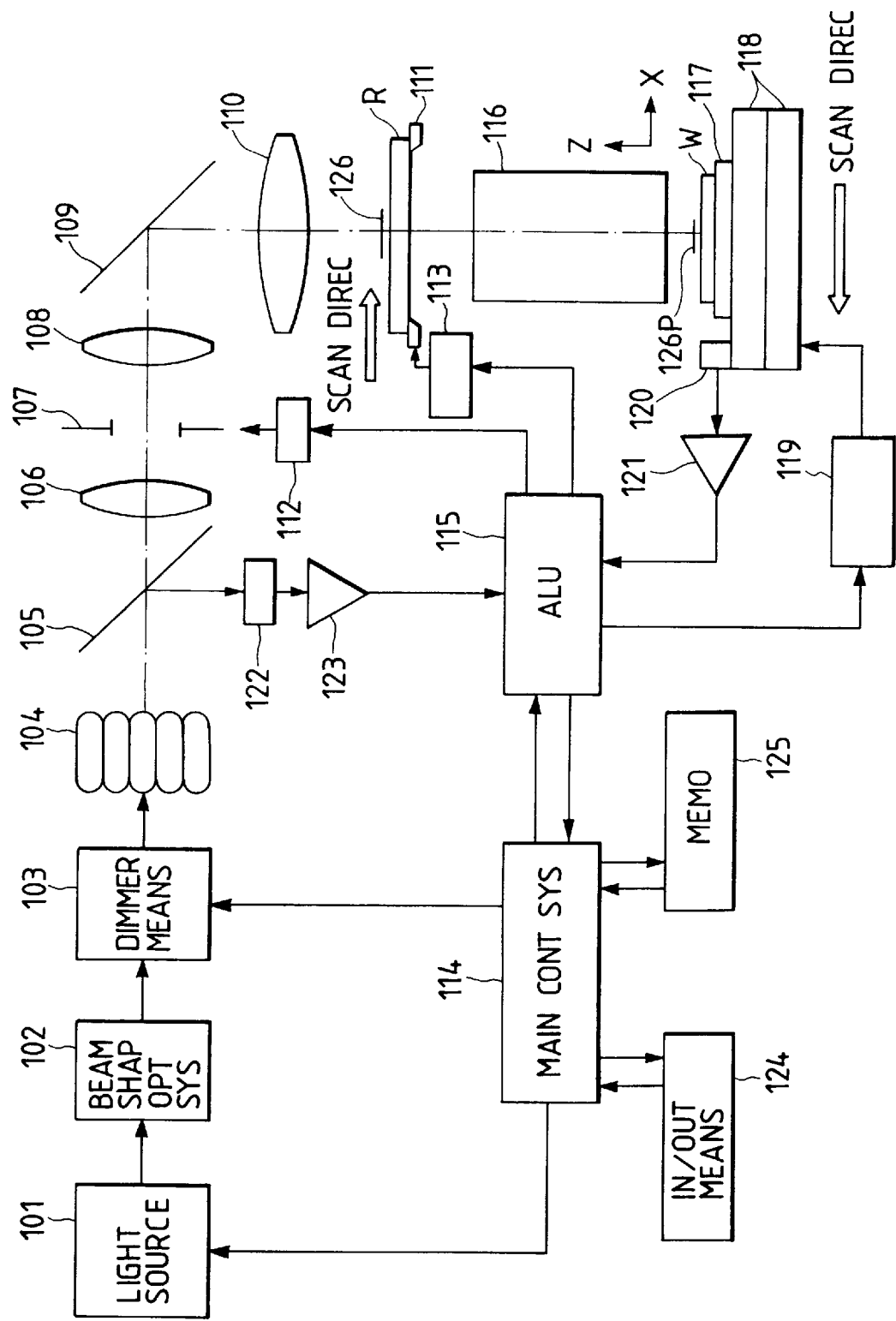

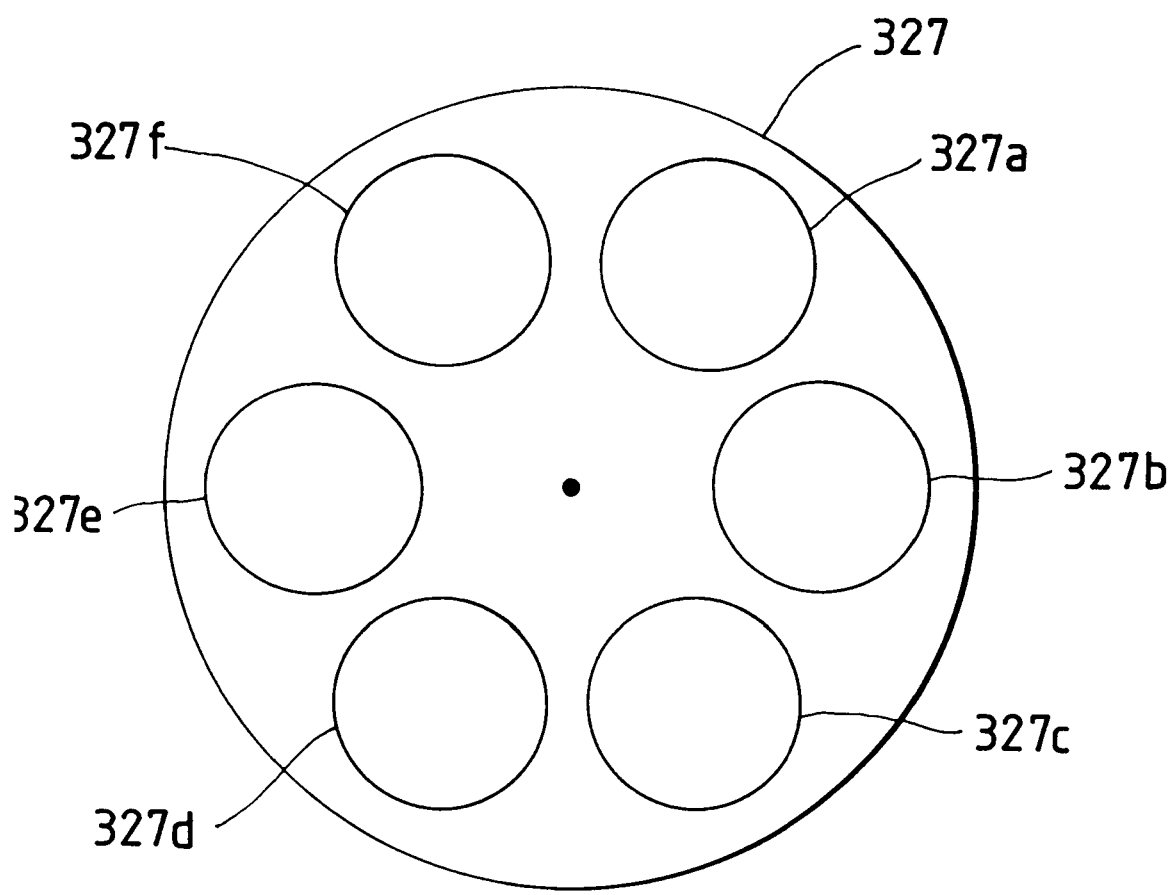

EXPOSURE METHOD AND APPARATUS

RELATED APPLICATION

This application is a continuation-in-part of application Ser. No. 08/451,656 filed May 30, 1995 abandoned, which is a continuation of application Ser. No. 08/368,387 filed Dec. 30, 1994 (abandoned), which is a continuation of application Ser. No. 08/187,553 filed Jan. 28, 1994 (abandoned). This application is also a continuation-in-part of application Ser. No. 08/622,920 U.S. Pat. No. 5,591,958; filed Mar. 27, 1996 now U.S Pat. No. 5,591,958, which is a continuation of application Ser. No. 08/260,398 filed Jun. 14, 1994 abandoned.

BACKGROUND OF THE INVENTION

1. Field of the Invention

The present invention relates to an exposure method and an exposure apparatus for implementing the same which are suitably applied to a scanning exposure apparatus for exposing a pattern on a mask onto a photosensitive substrate by synchronously scanning the mask and the photosensitive substrate.

More particularly, the present invention relates to an exposure method and apparatus to be used in a photolithography process for manufacturing a semiconductor device, a liquid crystal display device, a thin film magnetic head, etc.

2. Related Background Art

When a semiconductor device, a liquid crystal display device or a thin film magnetic head is to be manufactured by using a photo-lithography technology, a projection exposure apparatus which exposes a pattern of a photo-mask or a reticle (hereinafter collectively referred to as a reticle) onto a photosensitive substrate such as a wafer or a glass plate on which photo-resist is applied through a projection optical system has been used. Recently, as the size of a single chip pattern of the semiconductor device tends to increase, it is required to increase the exposure area on the photosensitive substrate so that a larger pattern of the reticle may be exposed.

In order to comply with the requirement of the increased area, a scanning projection exposure apparatus for exposing a pattern on a reticle onto a photosensitive substrate by synchronously scanning the reticle and the photosensitive substrate to an illumination area of rectangular, arcuate or hexagonal shape (hereinafter collectively referred to as a slit illumination area) has been developed (U.S. Pat. No. 4,747,678, U.S. Pat. No. 4,924,257). In the past, as shown in U.S. Pat. No. 5,194,893, in order to define a slit illumination area on the reticle, a movable light shielding means (view field diaphragm) for determining the slit illumination area is arranged at a position which is conjugate with the reticle or in the vicinity of the reticle. The shape of the slit illumination area on the reticle and the shape of the slit illumination area on the photosensitive substrate are controlled by a design constant or an apparatus constant.

In such a prior art apparatus, the following two major problems were encountered.

In general, an illumination optical system of the projection exposure apparatus is designed to illuminate the reticle with a uniform illumination light (exposure light). Accordingly, in the scanning projection exposure apparatus, in order to assure that the uniformity in the illumination is attained on the photosensitive substrate at the time when the exposure is completed after the scanning of the reticle and the photosensitive substrate relative to the slit illumination area, the width of the slit illumination area along the scan direction must be uniform.

Assuming that X represents the scan direction to the slit illumination area and Y represents a non-scan direction perpendicular to the scan direction, if the width of the slit illumination area along the scan direction is not uniform, the parallelism of the slit illumination area 30 along the scan direction is bad as shown in FIG. 5A, or edges of the slit illumination area 31 along the scan direction include unevenness as shown in FIG. 6A. In the case of FIG. 5A, a distribution of the exposure intensity E along the non-scan direction (Y axis) measured on the photosensitive substrate gradually increases or decreases along the Y axis as shown in FIG. 5B. On the other hand, in the case of FIG. 6A, a distribution of the exposure intensity E along the non-scan direction (Y axis) measured on the photosensitive substrate varies irregularly along the Y axis as shown in FIG. 6B.

In the present projection exposure apparatus, a design rule of less than 0.5 pm which is in a sub-micron area is used. It is reported that the uniformity of the exposure intensity required for the control of a line width in such an area is as small as ±1%. Accordingly, in order to attain a sufficient uniformity of the illumination in the scanning projection exposure apparatus, the reduced unevenness of the edge along the scan direction is required for a view field diaphragm (stop) for determining the slit illumination area, and the control of the motion in changing the width of the view field diaphragm along the scan direction while maintaining sufficient parallelism of the edge along the scan direction is required, as disclosed in Japanese Patent Application Laid-Open No. 4-196513. As a result, it is difficult to control the operation of the illumination area setting means while keeping the required precision if the view field diaphragm for defining the slit illumination area is varied in synchronism with the scan by a reason to be described later.

Further, as shown in FIG. 7, it is assumed that two circuit pattern areas 32A and 32B are arranged with a light shielding area of a width L1 therebetween on a reticle R, and the reticle R is scanned to a slit illumination area 33 of a width L2 along the scan direction. It is further assumed that the width L2 of the slit illumination area 33 is larger than the width L1 of the light shielding area between the circuit pattern areas 32A and 32B. In this case, if only the first circuit pattern area 32A of the reticle R is to be exposed onto the photosensitive substrate by the scanning exposure system, a portion of the pattern of the second circuit pattern area 32B is also transferred onto the photosensitive substrate.

In order to avoid the above problem, the width L1 of the light shielding area on the reticle R may be set to be sufficiently large but this would result in the reduction of the area of the circuit pattern area to be transferred. Alternatively, the width L2 of the slit illumination area 33 may be reduced in synchronism with the scan closely to the end of the exposure of the circuit pattern area 32A as shown in Japanese Laid-Open Patent Application No. 4-196513, but this would complicate the control mechanism for the variable view field diaphragm.

In the prior art projection exposure apparatus, the illumination optical system is designed to illuminate the reticle with a uniform illumination. Assuming that I (mW/cm$^2$) represents an illumination on a surface of the photo-sensitive substrate (image plane illumination), S (mJ/cm$^2$) represents a desired exposure intensity (sensitivity of a photosensitive material on the photosensitive substrate), D (mm) is a width of slit illumination area on the surface of the photosensitive substrate along the scan direction, and v (mm/sec) is a scan velocity of the photosensitive substrate, a required exposure time t (sec) is given by:

$$t = S/I = D/v \quad (1)$$

The exposure intensity S is entered by an operator and the illumination I is normally determined by the intensity of the available light source. Accordingly, in order to attain the exposure intensity S entered by the operator, it is necessary to determine the scan velocity v in accordance with the width D of the slit illumination area along the scan direction. If the exposure intensity S is so small that the scan velocity v exceeds a maximum scan velocity $v_{max}$ permitted to the apparatus, it is necessary to reduce the illumination I by dimmer means in the illumination optical system or reduce the width D of the slit illumination area along the scan direction. Assuming that M represents a projection magnification of the projection optical system, the scan velocity of the reticle is given by V/M (mm/sec).

FIGS. 11A to 11D show various examples of the areas corresponding to the slit illumination area on the photosensitive substrate. FIG. 11A shows an area 130 corresponding to a rectangular illumination area of a width D along the scan direction. FIG. 11B shows an area 131 corresponding to an arcuate illumination area of a width D along the scan direction. FIG. 11C shows an area 132 corresponding to a hexagonal illumination area of a width D along the scan direction as disclosed in Japanese Laid-Open Patent Application No. 46-34057, in which opposite ends 132a and 132b of the area 132 perpendicular to the scan direction (along the non-scan direction) overlap with the adjacent scan areas to assume advantageous shapes when they are scanned. FIG. 11D shows an area 133 corresponding to a diamond shaped illumination area of a width D along the scan direction as disclosed in Japanese Laid-Open Patent Application No. 53-25790, in which opposite ends 133a and 133b of the area 133 along the non-scan direction overlap with the adjacent scan areas to assume advantageous shapes when they are scanned.

However, since the prior art projection exposure apparatus is nor equipped with measurement means for the width D of the slit illumination area along the scan direction, it is difficult to expose to the photosensitive substrate with a proper exposure intensity if the actual width D along the scan direction deviates from a design value or the apparatus constant. Presently, reduction projection type exposure apparatuses (steppers) of a step-and-repeat system disclosed in e.g., U.S. Pat. Nos. 4,677,301 and 4,962,318 have been widely used. As illumination for exposure, emission lines (i-line and the like) from a mercury lamp, a KrF or ArF excimer laser or a higher harmonic such as of a metal vapor laser or a YAG laser is used.

In projection exposure apparatuses as disclosed in e.g., U.S. Pat. Nos. 4,712,910 and 4,884,101, a shutter is utilized to open and close the path of light from a light source thereby to control the amount of exposure. That is, the amount of exposure imparted to a wafer is controlled to an optimum value corresponding to the sensitivity of the photoresist of the wafer. Especially in projection type exposure apparatuses with pulsed laser light sources such as of an excimer laser or the like, as disclosed in, e.g., U.S. Pat. Nos. 4,970,546, 5,097,291 and 5,191,374, an amount of energy per pulse is set to a predetermined value thereby to control the amount of exposure.

Recently, as semiconductors become large in size and minute in structure, it is required to enlarge the image field of the projection optical system and to improve the resolution thereof. However, it is extremely difficult to obtain both the high resolution and the large image field in the projection optical system from the viewpoint of design and manufacture. Therefore, as disclosed in, e.g., U.S. Pat. Nos. 4,747, 678, 4,924,257 and 5,194,893, scanning type projection exposure apparatuses are paid attention in which only a local area of a reticle is illuminated and the reticle and a wafer are shifted synchronously to expose the pattern of the reticle to the wafer. In such scanning type exposure apparatuses, even though the image field of a projection optical system is small, it is possible to exposure a pattern with a large area to the wafer and to improve the resolution of the projection optical system comparatively easily.

However, if the conventional exposure control method is applied to such scanning type exposure apparatuses, the amount of exposure to the wafer cannot be controlled to an optimum value corresponding to the sensitivity of the photoresist. That is, in a scanning type exposure apparatus with a light source emitting continuous light such as of i-lines, even though only a time for opening a shutter is controlled as in U.S. Pat. No. 4,712,910, an optimum amount of exposure cannot be imparted to the wafer. Also, when the sensitivity of the photoresist is changed, the amount of exposure cannot be controlled properly in accordance with the change. Further, in a scanning type exposure apparatus with a light source emitting a light beam such as an excimer laser, etc., there is a chance that the number of light beams illuminating a wafer is different in various positions on the wafer in accordance with the relationship between the rate of movement of the wafer and the timing of emissions of light beams. Namely, there is a change that unevenness of the amount of light occurs.

SUMMARY OF THE INVENTION

It is an object of the present invention to provide a scanning exposure apparatus for exposing a pattern on a reticle onto a photosensitive substrate by synchronously scanning the reticle and the photosensitive substrate to a slit illumination area, wherein light shielding means (view field diaphragm) for defining the slit illumination area may be arranged in spaced relation with the reticle and only a pattern of a desired pattern area of a plurality of pattern areas on the reticle may be transferred onto the photosensitive substrate without changing the width of the slit illumination area during the exposure.

It is another object of the present invention to provide an exposure method to allow the exposure with a proper exposure intensity onto the photosensitive substrate when the pattern on the reticle is to be exposed onto the photosensitive substrate by synchronously scanning the reticle and the photosensitive substrate relative to the slit illumination area, and an exposure apparatus for implementing such exposure method.

The exposure apparatus of the present invention comprises an illumination optical system for illuminating a slit illumination area on a mask on which a pattern to be transferred is formed, and relative scan means for synchronously scanning the mask and a photosensitive substrate on which a pattern of the mask is to be exposed, relative to the slit illumination area. The pattern on the mask is exposed onto the photosensitive substrate by synchronously scanning the mask and the photosensitive substrate relative to the slit illumination area. Light shielding means for shielding an area on the mask which is not to be illuminated by the slit illumination area defined by the illumination optical system is also provided.

It is preferable to provide auxiliary scan means for scanning the light shielding means in synchronism with the scan of the mask by the relative scan means.

It is also preferable that the relative scan means is shared by the auxiliary scan means and the auxiliary scan means integrally scans the mask and the light shielding means.

The light shielding means may shield a predetermined fixed area on the mask.

In accordance with the present invention, the slit illumination area on the mask is defined by illumination area defining means (diaphragm member) arrange at a spaced position from the mask, for example, in a plane in the illumination optical system which is conjugate with the mask. Since the illumination area defining means is at the spaced position from the mask, the illumination area defining means may be precisely prefabricated or preadjusted so that a high uniformity of illumination on the photosensitive substrate after the scan is maintained.

When the illumination area defining means is arranged at the spaced position from the mask and the illumination area defining means is not to be driven during the first scanning exposure, and if a pattern of a desired circuit pattern area of a plurality of circuit pattern areas which are adjacent in the mask along the scan direction is to be exposed onto the photosensitive substrate, patterns of the other circuit pattern areas may also be exposed onto the photosensitive substrate. Thus, the other circuit pattern areas are shielded by the light shielding means arranged in the vicinity of the mask to prevent the exposure of the patterns of the other circuit pattern areas.

Where the auxiliary scan means for scanning the light shielding means in synchronism with the scan of the mask by the relative scan means is provided, it is not necessary to change the shape of the opening of the light shielding means during one exposure cycle and the control of the light shielding means is facilitated.

Where the relative scan means is shared by the auxiliary scan means and the relative scan means integrally scans the mask and the light shielding means, it is not necessary to additionally provide the scan means for the light shielding means and the construction is simplified.

Where the light shielding means shields the predetermined fixed area on the mask, it is not necessary to provide a mechanism for changing the shape of the opening in the light shielding means.

In accordance with the exposure method of the present invention, a slit illumination area on a mask on which a pattern to be transferred is formed is illuminated, and the mask and a photosensitive substrate are synchronously scanned relative to the slit illumination area to expose the pattern on the mask onto the photosensitive substrate. A measurement mask having an opening formed therein to pass a light of the slit illumination area therethrough is arranged and a width of an area corresponding to the slit illumination area on the photosensitive substrate along the scan direction is measured. A scan velocity of the mask and the photosensitive substrate and an exposure energy per unit time in the area on the photosensitive substrate corresponding to the slit illumination area are controlled in accordance with the measured width.

The exposure apparatus of the present invention comprises an illumination optical system for illuminating a slit illumination area on a mask on which a pattern to be transferred is formed, and relative scan means for synchronously scanning a photosensitive substrate to which a pattern of the mask held on a stage is to be exposed and the mask relative to slit illumination area. The mask and the photosensitive substrate are synchronously scanned relative to the slit illumination area to expose the pattern on the mask onto the photosensitive substrate. Measurement means is mounted on the stage for measuring the width of the slit illumination area on the photosensitive substrate along the scan direction, and exposure intensity control means for controlling the exposure energy to the photosensitive substrate in accordance with the measured width is provided.

It is preferable that the measurement means is shared by photoelectric detection means for measuring the uniformity in the illumination on the stage of the illumination light from the illumination optical system.

It is further preferable to provide correction means for correcting the width of the slit illumination area along the scan direction in accordance with the width along the scan direction of the slit illumination means measured by the measurement means.

In accordance with the exposure method of the present invention, the actual width along the scan direction of the area corresponding to the slit illumination area on the plane of the photosensitive substrate is measured before the pattern of the mask is exposed onto the photosensitive substrate. Accordingly, the scan velocity of the mask and the photosensitive substrate relative to the slit illumination area and the exposure energy per unit time to the photosensitive substrate are controlled in accordance with the measured width to precisely control the exposure intensity to the photosensitive substrate to a proper exposure intensity.

In accordance with the exposure apparatus of the present invention, the width along the scan direction of the area on the photosensitive substrate corresponding to the slit illumination area may be measured by the measurement means and the exposure intensity to the photosensitive substrate is precisely controlled to the proper exposure intensity in accordance with the measured width.

Where the measurement means is shared by the photoelectric detection means for measuring the uniformity in the illumination on the stage of the illumination light from the illumination optical system, it is not necessary to additionally provide the measurement means.

Where the correction means for correcting the width of the slit illumination area along the scan direction in accordance with the width along the scan direction of the slit illumination area on the photosensitive substrate measured by the measurement means is provided, the width may be precisely set to the preset width.

It is a third object of the present invention to provide a scanning type exposure apparatus in which even though the pattern of a reticle is scanned and exposed to a photosensitive substrate by the use of a light source for emitting continuous light, an optimum amount of exposure can be imparted to the photosensitive substrate in accordance with the sensitivity thereof without lowering the throughput and incurring unevenness of illuminance.

It is a fourth object of the present invention to provide a scanning type exposure apparatus in which even though the pattern of a reticle is scanned and exposed to a photosensitive substrate by use of a light source for emitting laser lights, an optimum amount of exposure can be imparted to the photosensitive substrate without causing unevenness of the quantity of light.

Therefore, a first apparatus for attaining the third object of the present invention has a light source for emitting continuous light, an illumination optical system for illuminating a local area on a mask with light from the light source and a projection optical system for projecting the image of the pattern of the mask within the local area to a photosensitive substrate with a photosensitive material applied thereon and, the pattern of the mask is scanned and exposed on the sensitive substrate by synchronously shifting the mask and the photosensitive substrate in a predetermined scanning direction perpendicular to an optical axis of the projection optical system. The first apparatus further has an adjusting device for adjusting the intensity of the light to be incident on the substrate and a control device for controlling the adjusting device in accordance with the sensitivity characteristic of the photosensitive material, the speed of the substrate and the width of a projection area of the pattern of the mask by the projection optical system in the scanning direction. Therefore, even though the sensitivity characteristic of the photosensitive material is changed, the intensity of the light is changed accordingly, so that an optimum amount of exposure can be imparted to the substrate. In particular, when the photosensitive material has a low sensitivity, the intensity of the light is increased, so that the speed of the substrate can be maintained to an upper limit (the maximum speed of the substrate stage). Therefore, the lowering of the throughput can be prevented. On the other hand, when the photosensitive material has a high sensitivity, even though the speed of the substrate reaches the upper limit (the maximum speed of the substrate stage), the intensity of the light is decreased, so that an optimum amount of exposure can be imparted to the substrate.

Also, a second apparatus for attaining the third object of the present invention has a light source for emitting continuous light, an illumination optical system for illuminating a local area on a mask with the light from the light source and a projection optical system for projecting the image of a pattern on the mask within the local area to a substrate with a photosensitive material applied thereto. And, the image of the pattern of the mask is scanned and exposed on the substrate by synchronously shifting the mask and the substrate in a predetermined scanning direction perpendicular to the optical axis of the projection optical system. The second apparatus further has an optical member for varying the width of the local area on the mask in the scanning direction and a control device for controlling the optical member in accordance with the intensity of the light to be incident on the substrate, the sensitivity characteristic of the photosensitive material and the speed of the substrate. Therefore, even though the sensitivity characteristic is changed, an optimum amount of exposure can be imparted to the substrate, as the width of the projection area of the pattern of the mask by the projection optical system in the scanning direction is changed. In particular, when the photosensitive material has a low sensitivity, the width of the local illumination area on the mask in the scanning direction is enlarged, so that the speed of the substrate can be maintained to an upper limit (the maximum speed of the substrate stage). Therefore, the lowering of the throughput can be prevented. On the other hand, when the photosensitive material has a high sensitivity, even though the speed of the substrate reaches an upper limit (the maximum speed of the substrate stage), the width of the local illumination area is narrowed, so that an optimum amount of exposure can be imparted to the substrate.

Further, the second apparatus for attaining the third object of the present invention may be provided with a detecting device for detecting the intensity of light to be incident on the substrate and the control device may control the adjusting device in accordance with the output of the detecting device. In this case, even though the intensity (illuminance) of the light is changed with the passage of time, the width of the local illumination area in the scanning direction can be changed in accordance with the change of the intensity, whereby an optimum amount of exposure can be imparted to the substrate.

In the apparatuses of the present invention for achieving the third object, if the magnification of the projection optical system is $\beta$ (e.g., $\beta = \frac{1}{5}$, or $\frac{1}{4}$), the width of the local illumination area on the mask in the scanning direction is $L_R$, and the width of the projection area (the similar area with respect to the local illumination area) of the pattern of the mask by the projection optical system in the scanning direction is $L_W$, the widths $L_R$ and $L_W$ are in the following relation:

$$L_R = (1/\beta) \cdot L_W \quad \text{(II-1)}$$

If the scanning speed of the substrate is $V_W$, the scanning speed of the mask is $V_R$, the speeds $V_R$ and $V_W$ are in the following relation:

$$V_R = (1/\beta) \cdot V_W \quad \text{(II-2)}$$

When utilizing the light source for emitting continuous light, if the illuminance of the light on the substrate is Q, and the sensitivity (corresponding to the optimum amount of exposure) of the photosensitive material on the substrate is P, the exposure time t necessary for obtaining an optimum amount of exposure at a point is expressed as:

$$t = P/Q \quad \text{(II-3)}$$

From the equations (II-1) and (II-2), the exposure time t' at a point on the substrate when the substrate is shifted at the speed $V_W$ with respect to the projection area of the mask pattern having the width $L_W$ is expressed as:

$$t' = L_W/V_W \quad \text{(II-4)}$$

Therefore, in order to make the exposure time t of the equation (II-3) equal to the exposure time t' of the equation (II-4), the following equation needs to hold:

$$P/Q = L_W/V_W, \text{ i.e., } P \cdot V_W = L_W \cdot Q \quad \text{(II-5)}$$

That is, in order to impart an optimum amount of exposure to the substrate in accordance to the sensitivity P of the photosensitive material, it is necessary to determine the width $L_W$ of the projection area, the illuminance Q of the light on the substrate and the scanning speed of the substrate $V_W$ in accordance with the sensitivity P so as to satisfy the equation (II-5). Then, in the present invention, while aiming at the equation (II-5), at least one of the width $L_W$, the illuminance Q and the speed $V_W$ is made variable to impart an optimum amount of exposure to the substrate in accordance with the sensitivity P of the photosensitive material. Therefore, even though the sensitivity P of the photosensitive material is changed, an optimum amount of exposure can be imparted to the substrate.

When the equation (II-2) is substituted into the equation (II-5), the scanning speed $V_R$ of the mask is expressed as:

$$V_R = L_W \cdot Q/(\beta \cdot P) \quad \text{(II-6)}$$

Accordingly, when the width $L_W$ of the projection area, the illuminance Q and the magnification $\beta$ are constant, the scanning speed of the mask is changed reasonably in accordance with the sensitivity P of the photosensitive material. Generally, in scanning type exposure apparatuses for manufacturing semiconductors, the projection optical system is the reduction type. That is, the magnification of the projection optical system $\beta$ is less than 1. Therefore, as is apparent from the equation (II-2), the scanning speed $V_W$ of the substrate is faster than the scanning speed $V_R$. Then, when the upper limit $V_{Rmax}$ (maximum speed of the mask stage)

of the scanning speed of the mask is less than $1/\beta$ times the upper limit $V_{Wmax}$ (maximum speed of the substrate stage) of the scanning speed of the substrate, i.e., $V_{Rmax} < V_{Wmax}$ holds, the mask rather than the substrate easily reaches the upper limit. Accordingly, as the scanning speed $V_R$ of the mask needs to be set to equal to or less than the upper limit $V_{Rmax}$ inevitably, the following relation holds from the equation (II-6). When the following equation (II-7) holds, the scanning speed $V_W$ of the substrate will not exceed the upper limit $V_{Wmax}$.

$$V_R = L_W \cdot Q/(\beta \cdot P) \leq V_{Rmax} \quad \text{(II-7)}$$

In order to impart an optimum amount of exposure to the substrate in accordance with the sensitivity P of the photosensitive material in consideration of the upper limit $V_{Rmax}$ of the scanning speed of the mask, it is necessary to determine the width $L_W$ of the projection area, the illuminance Q of the light on the substrate and the scanning speed $V_W$ of the substrate.

In conventional scanning exposure apparatuses, only the scanning speeds $V_W$ and $V_R$ of the substrate and mask are made variable. Therefore, depending on the type of photosensitive material, there is a case that the scanning speed $V_W$ of the substrate determined from the equation (II-5) in accordance with its sensitivity does not satisfy the equation (II-7). Especially, when utilizing a photosensitive material with a high sensitivity (the value of the sensitivity P is small), the value of the left side of the expression (II-7) becomes large and the scanning speed $V_R$ of the mask might exceed the upper limit $V_{Rmax}$.

Then, in the present invention, according to the upper limit $V_{Rmax}$, at least one of the width $L_W$ of the projection area and the illuminance Q is made variable and the scanning speed $V_W$ of the substrate and at least one of the width $L_W$ are determined in accordance with the sensitivity P of the photosensitive material so as to satisfy the expressions (II-5) and (II-7). For example, in a photosensitive material with a high sensitivity, the width $L_W$ of the projection area of the mask pattern (i.e., the width of the local illumination area on the mask) is narrowed, or the illuminance Q of the light on the substrate is decreased. Therefore, even in such a highly sensitive photosensitive material, the scanning speed $V_R$ of the mask will not exceed the upper limit $V_{Rmax}$ and an optimum amount of exposure can be imparted to the substrate. At this time, when the scanning speed $V_R$ of the mask is set to the upper limit $V_{Rmax}$ and the scanning speed $V_W$ is set to $\beta \cdot V_{Rmax}$, the throughput becomes preferable while an optimum amount of exposure is imparted to the substrate.

On the other hand, when utilizing a photosensitive material having a low sensitivity (the value of the sensitivity P is large), the value of the left side of the expression (II-7) becomes small. Therefore, even though only the scanning speeds $V_W$, $V_R$ of the substrate and mask are made variable, the scanning speed $V_R$ becomes slow but will not exceed the upper limit $V_{Rmax}$ and an optimum amount of exposure can be imparted to the substrate. However, the decrease of the scanning speed of the mask (substrate) leads to lowering of the throughput. Therefore, even when the photosensitive material with the low sensitivity is utilized, it is desirable to make one of the width $L_W$ of the projection area and the illuminance Q variable. That is, in the photosensitive material with the low sensitivity, while the scanning speed $V_R$ of the mask is maintained to the upper limit $V_{Rmax}$, at least one of the width $L_W$ and the illuminance Q should be determined in accordance with the sensitivity P so as to satisfy the expressions (II-5) and (II-7). At this time, the width $L_W$ of the projection area of the mask pattern is widened or the illuminance Q of the light on the substrate is increased. Accordingly, even in the photosensitive material with the low sensitivity, an optimum amount of exposure can be imparted to the substrate while the lowering of the throughput is prevented.

The above description is directed to the case in which $V_{Rmax} < V_{Wmax}/\beta$ holds, but when $V_{Rmax} \geq V_{Wmax}/\beta$ holds, the width $L_W$ of the projection area, the illuminance Q and the scanning speed $V_W$ of the substrate should be determined so as to satisfy both the expression (II-5) and the following expression (II-8):

$$V_W = L_W \cdot Q/P \leq V_{Wmax} \quad \text{(II-8)}$$

When the expression (II-8) holds, the scanning speed $V_R$ of the mask never exceeds the upper limit $V_{Rmax}$. Also, even though all three conditions of the width $L_W$, the illuminance Q and the speed $V_W$ are not made variable, it is sufficient to determine one or two variable conditions to satisfy the expressions (II-5) and (II-8) such that the scanning speed $V_W$ of the substrate will not exceed the upper limit $V_{Wmax}$ and the throughput is not lowered.

An apparatus for attaining the fourth object of the present invention has a light source for emitting a light beam, an illumination optical system for illuminating a local area on a mask with the pulsed light from the light source and a projection optical system for projecting the image of the pattern of the mask within the local area to a substrate with a photosensitive material applied thereto. The image of the pattern of the mask is scanned and exposed on the substrate by synchronously shifting the mask and the substrate in a predetermined scanning direction perpendicular to the optical axis of the projection optical system. In this embodiment, the width of the projection area of the pattern of the mask by the projection optical system (a similar area with respect to the local illumination area on the wafer) in the scanning direction is set to an integer multiple of the distance by which the substrate is shifted relatively with respect to the projection area of the pattern of the mask for a period of the light emission of the light source.

As above, in this apparatus, e.g., in FIG. 24A, the width $\beta \cdot L$ of the projection area (546P) of the pattern of the mask on the substrate (515) by the projection optical system is n times the distance $\Delta L$ by which the substrate is shifted for the period of the light emission of the light source in the DW direction. That is, the following equation hold:

$$\beta \cdot L = n \cdot \Delta L.$$

In this case, a position on the substrate on which an edge of the projection area (546P) is located when a light emission from the light source is done is a point P1 and the energy imparted to each position on the substrate for a light emission is assumed to be $\Delta E$. Then, an energy of $\Delta E/2$ is imparted to the point P1 on the edge of the projection area (546P) at the time of a light emission. Therefore, the total energy of $E_{P1}$ is imparted to the point P1 is as follows:

$$E_{P1} = 2 \times \Delta E/2 + (n-1) \times \Delta E = n \times \Delta E.$$

Also, with respect to a point P2 located slightly inside the edge of the projection area (546P), n light emissions are carried out while the point P2 is located within the projection area (546P). Namely, an energy of $n \times \Delta E$ is imparted to the point P2. As a result, the energy of $n \times \Delta E$ is imparted to each position on the substrate, so that unevenness of the illuminance does not occur.

On the other hand, in FIG. 24B, the width of the projection area (546P) of the pattern of the mask on the substrate in the DW direction is β·L1 and 3.5 times the distance ΔL by which the substrate is shifted in the DW direction for the period of the light emission of the light source. In this case, when the position on the substrate on which an edge of the projection area (546P) is located is Q1, an amount of energy imparted to the point Q1 is 3.5×ΔE. Also, an amount $E_{Q2}$ of energy imparted to a point Q2 located slightly inside the edge of the projection area (546P) is 4×ΔE while an amount $E_{Q3}$ of energy imparted to a point Q3 located slightly outside the projection area is 3×ΔE. Therefore, the amount of energy imparted to each position on the substrate is varied within the range of 3×ΔE to 4×ΔE, thereby causing unevenness of the illuminance.

BRIEF DESCRIPTION OF THE DRAWINGS

FIG. 2 shows a configuration of a drive mechanism for a reticle R and light shielding plates 8A and 8B of FIG. 1, FIG. 7 shows a relation between a plurality of circuit pattern areas arranged on the reticle and the slit illumination area, FIG. 8 shows a configuration of another embodiment of the projection exposure apparatus of the present invention.

FIG. 14 shows the structure of a rotatable light reducing filter plate in FIG. 12;

DETAILED DESCRIPTION OF THE PREFERRED EMBODIMENTS

An embodiment of the exposure apparatus of the present invention is now explained with reference to FIGS. 3A to 3C. In the present embodiment, the present invention is applied to a scanning projection exposure apparatus.

Figure 1:
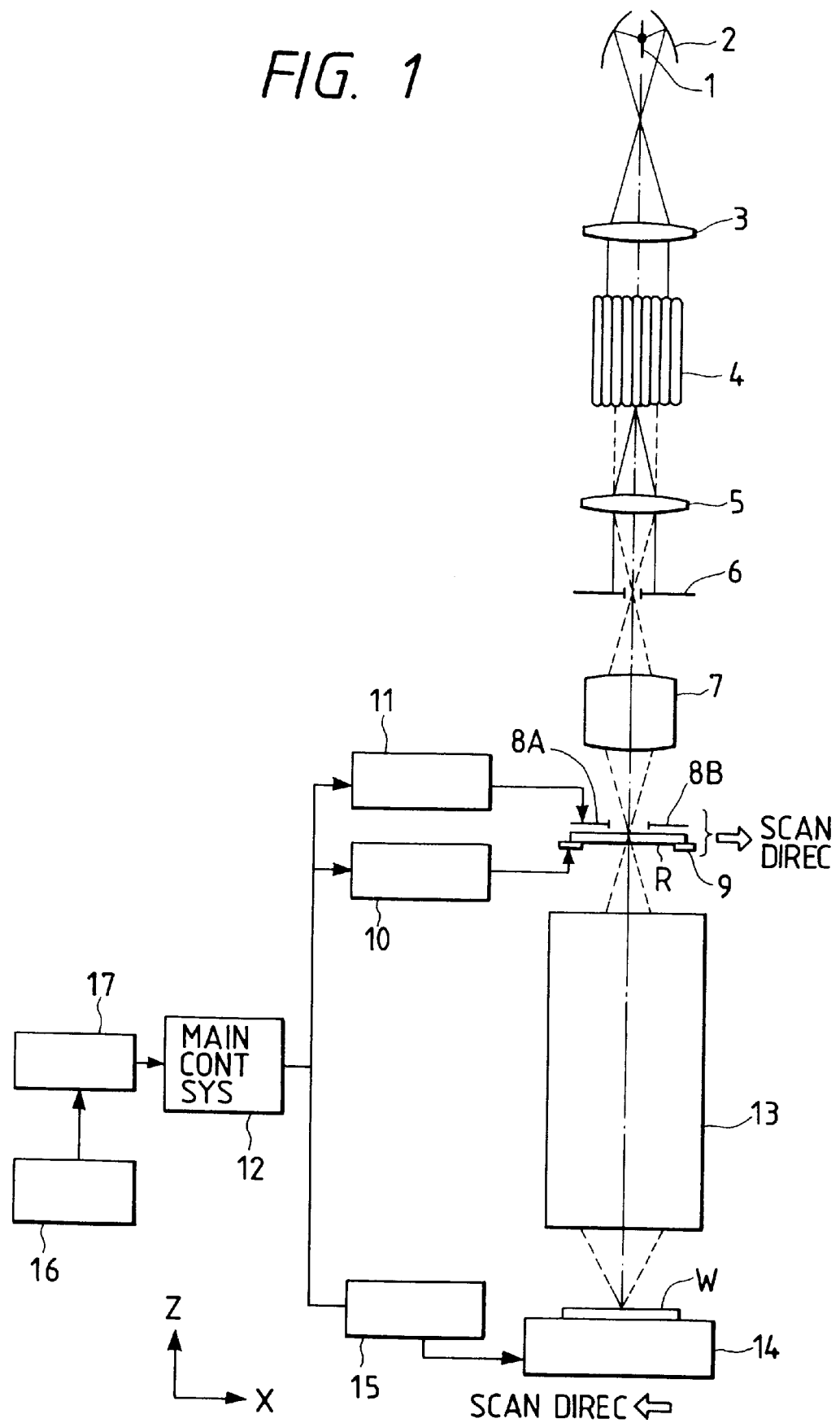
FIG. 1 shows a configuration of one embodiment of a projection exposure apparatus of the present invention.

FIG. 1 shows a projection exposure apparatus of the present embodiment. In FIG. 1, a reticle R is illuminated by a rectangular slit illumination area with a uniform illumination through an illumination optical system including a light source 1 to a relay lens 7, and a circuit pattern of the reticle R illuminated by the slit illumination area is transferred onto a wafer W by a projection optical system 13.

An illumination light from the light source 1 such as a mercury lamp is focused by an elliptic mirror 2 and collimated by a collimator lens 3, and it is directed to a fly eye lens 4. Where the light source is a coherent light source such as an excimer laser light source, the illumination light emitted from the coherent light source passes through a beam shaping optical system such as a cylindrical lens or a beam expander instead of the elliptic mirror 2 and the collimator lens 3 and it is directed to the fly eye lens 4. A number of secondary light sources are formed on an exit plane of the fly eye lens 4 and the illumination lights from the exit plane are condensed by a condenser lens 5 and directed to a view field diaphragm 6.

A rectangular slit opening is formed in the view field diaphragm 6. The light beam transmitted through the view field diaphragm is converted to a light beam having a slit shaped sectional area and it is directed to the relay lens 7 which serves to render the view field diaphragm 6 and the circuit pattern formation plane of the reticle R conjugate. The illumination light is projected to the area on the reticle R which is conjugate with the slit opening of the view field diaphragm 6, that is, the slit illumination area on the reticle R. The relay lens system 7 is a double-end teleocentric optical system and the teleocentricity is maintained in the rectangular slit illumination area on the reticle R.

In the reticle R of the present embodiment, two light shielding plates 8A and 8B spaced along the scan direction for the slit illumination area are arranged on the reticle R closely to the reticle R, and the reticle R and the light shielding plates 8A and 8B are mounted on a reticle stage 9. A reticle blind is formed by the light shielding plates 8A and 8B, and an image of the circuit pattern on the reticle R between the light shielding plates 8A and 8B in the slit illumination area is projected and exposed onto a wafer W through a projection optical system 13. In a two-dimensional plane perpendicular to an optical axis of the projection optical system 13, X represents the scan direction of the reticle to the slit illumination area and Z represents a direction parallel to the optical axis of the projection optical system 13.

The reticle R and the light shielding plates 8A and 8B are integrally driven by a reticle stage drive unit 10 along the X axis which is in the scan direction, and the light shielding plates 8A and 8B are supported on the reticle stage 9 such that they are independently driven along the X axis by a light shielding plate drive unit 11. The operation of the reticle stage drive unit 10 and the light shielding plate drive unit 11 is controlled by a main control unit 12 which controls the overall operation of the apparatus. The wafer W is mounted on a wafer stage 14 which comprises an XY stage for positioning the wafer W in a plane normal to the optical axis of the projection optical system 13 and a Z stage for positioning the wafer W along the Z axis. The main control unit 12 controls the positioning of the wafer stage 14 and the scan operation through a wafer stage drive unit 15.

When the pattern on the reticle R is to be exposed to the wafer W through the projection optical system 13, the reticle R and the light shielding plates 8A and 8B are integrally scanned through the reticle stage along the X axis relative to the rectangular slit illumination area defined by the view field diaphragm 6. In synchronism with the scan, the wafer W is scanned through the wafer stage 14 along the −X axis relative to the image of the rectangular slit illumination area by the projection optical system. Namely, the −X axis is the scan direction of the wafer W. By synchronously scanning the reticle R and the wafer W, the circuit pattern of the reticle R is sequentially transferred onto the wafer W.

Recently, in order to improve a throughput by reducing a time required for the replacement of the reticle, it has been proposed to provide a plurality of circuit pattern areas on the reticle. In order to select a circuit pattern area to be transferred from the plurality of circuit patterns on the reticle R, the light shielding plates 8A and 8B are used. In the projection exposure apparatus of the present embodiment, an input unit 16 for inputting information on the circuit pattern area on the reticle R and a memory unit 17 for storing the input information of the input unit 16 are provided, and the main control unit 12 render the opening defined by the light shielding plates 8A and 8B to a predetermined shape through the light shielding plate drive unit 11 in accordance with the input information of the memory unit 17.

Referring now to FIG. 2, the drive mechanism for the light shielding plates 8A and 8B is explained.

FIG. 2 shows a detailed configuration of a periphery of the reticle R in FIG. 1. In FIG. 2, the reticle stage 9 is slidably supported along the scan direction (X axis) on a reticle stage base 19, and the reticle R is held to an inner side of the reticle stage 9 by a vacuum chuck. A portion of the reticle stage 9 which corresponds to a circuit pattern formation area of the reticle R is an opening, and an area on the reticle stage base 19 which corresponds to a maximum slit illumination area is also an opening. The light shielding plates 8A and 8B are mounted to the opposite ends of the reticle stage along the scan direction through lead screw members 18A and 18B such as warms and gears. The lead screw members 18A and 18B are independently driven by the light shielding plate drive unit 11 of FIG. 1 to independently drive the light shielding members 8A and 8B along the scan direction.

In FIG. 2, the light shielding plate which is perpendicular to the plane of FIG. 2 and transverse to the scan direction (X axis) is not shown, but this light shielding plate in the non-scan direction may be arranged in the vicinity of the reticle R as are the light shielding plates 8A and 8B, or it may be arranged at a position which is substantially conjugate with the reticle R as is the view field diaphragm 6 of FIG. 1.

In the embodiment of FIG. 2, the light shielding members 8A and 8B are integrally mounted through the lead screw members 18A and 18B on the reticle stage 9 which holds the reticle R and is movable along at least the X axis (scan direction). Accordingly, in the scan and exposure mode, the light shielding plates 8A and 8B are also driven along the scan direction (X axis) in synchronism with the scan of the reticle R by the reticle stage 9. As a result, in the present embodiment, it is not necessary to provide additional scan means for scanning (driving) the light shielding means 8A and 8B in synchronism with the scan of the reticle R. In other words, in the present embodiment, the reticle stage 9 and the drive unit 10 correspond to the auxiliary scan means for the light shielding means 8A and 8B.

Instead of providing the light shielding plates 8A and 8B on the reticle stage as they are in the present embodiment, the light shielding plates 8A and 8B may be arranged on the reticle stage base 19 of FIG. 2. In this case, however, even if the reticle R is moved along the scan direction (X axis) by the reticle stage 9, the light shielding plates 8A and 8B are not moved on the reticle stage base 19. In such a case, it is necessary to provide auxiliary scan means for driving the light shielding plates 8A and 8B in synchronism with the scan of the reticle R, as the auxiliary scan means, a movable member which holds the light shielding plates 8A and 8B on the reticle stage base 19 and is movable along at least the X axis, and a control unit for driving the movable member in synchronism with the scan of the reticle R may be provided. Specifically, the light shielding plates 8A and 8B are provided on the reticle stage base 19 through the lead screw members 18A and 18B and the control unit 11 drives the light shielding plates 8A and 8B in synchronism with the scan of the reticle R.

In the present embodiment, the light shielding plates 8A and 8B are arranged closely to the upper side (facing the light source 1) of the reticle R as shown in FIG. 1. Alternatively, the light shielding plates 8A and 8B may be arranged on the lower side (facing the projection optical system 13) of the reticle R. Specifically, the light shielding plates 8A and 8B are arranged on the reticle stage base 19 through the lead screw members 18A and 18B in FIG. 2, or the light shielding members 8A and 8B may be integrally arranged on the reticle stage 9 through a fixed member (or the lead screw members). In the former case, however, it is necessary to drive the light shielding plates 8A and 8B by the lead screw members 18A and 18B in synchronism with the scan of the reticle R.

Figure 3A:
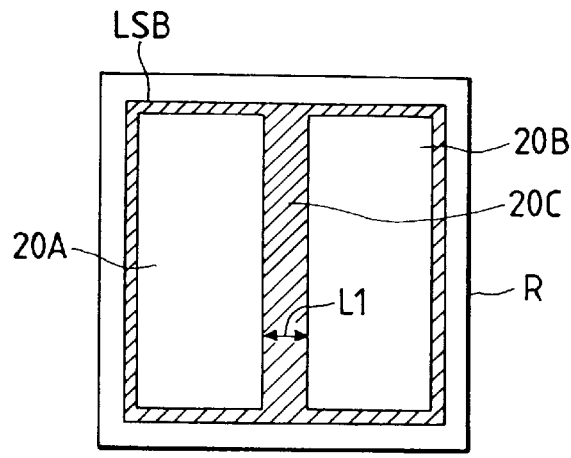
FIG. 3A shows a plan view of a pattern on the reticle R of FIG. 1.

Usually, the reticle R has one or more circuit patterns and a light shielding band of a predetermined width is formed to surround the circuit pattern (FIG. 3A). In other words, the circuit pattern is formed within the area of a predetermined shape (normally rectangular) surrounded by the light shielding band. Accordingly, when the areas other than the circuit pattern to be transferred are to be shielded from the light by the light shielding plates 8A and 8B as described above, the light shielding plates 8A and 8B are positioned by the lead screw members 18A and 18B such that the edges of the light shielding plates 8A and 8B are brought into the light shielding band (LSB in FIG. 3A) which surrounds the circuit pattern to be transferred. As a result, the positioning precision of the light shielding plates 8A and 8B by the lead screw members 18A and 18B may be low. As described above, when the light shielding plates 8A and 8B are arranged on the reticle stage base 19, the light shielding plates 8A and 8B are driven in synchronism with the scan of the reticle R by the lead screw members 18A and 18B such that the edges of the light shielding plates 8A and 8B do not go beyond the light shielding band. In the following description, in order to simplify the description, it is assumed that the edges of the light shielding plates 8A and 8B are positioned in the light shielding band when the light shielding plates BA and 8B are driven and the description thereof is omitted.

Figure 3B:
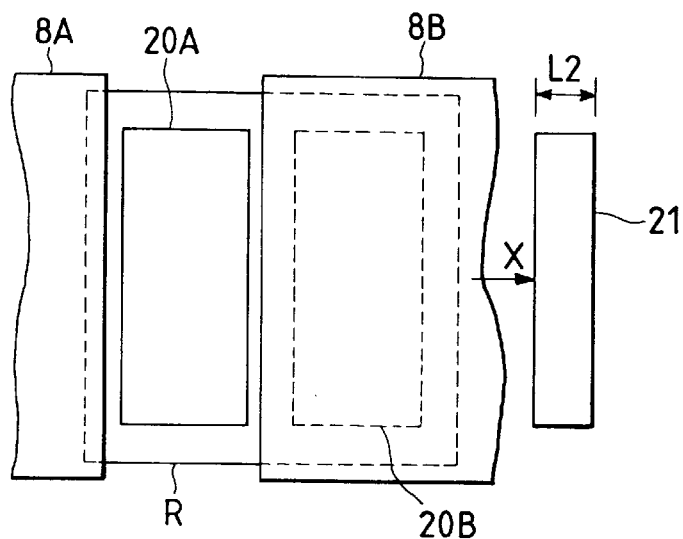
FIG. 3B shows a plan view of an arrangement of the light shielding plates 8A and 8B when a pattern of a circuit pattern area 20A is to be exposed.
Figure 3C:
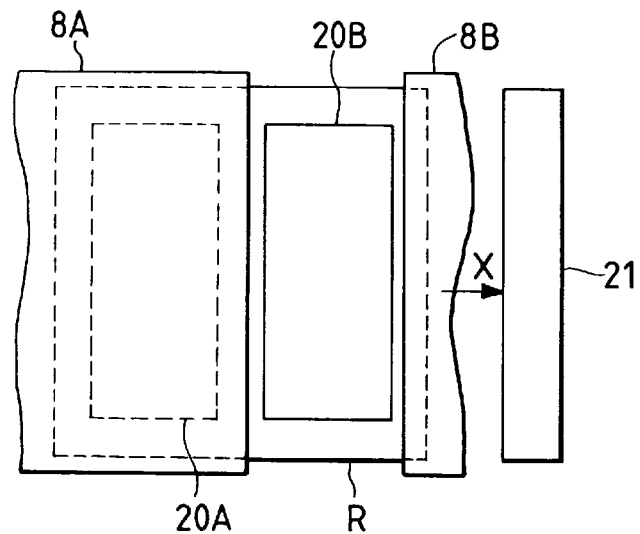
FIG. 3C shows a plan view of an arrangement of the light shielding plates 8A and 8B when a pattern of a circuit pattern area 20B is to be exposed.

Referring to FIGS. 1 and 3A to 3C, the operation of the exposure by a slit scan exposure system is explained. As shown in FIG. 3A, two circuit pattern areas 20A and 20B are formed on the reticle R, a light shielding area 20C having a width L1 along the scan direction is formed on a boundary of the circuit pattern areas 20A and 20B and a light shielding band LSB of a predetermined width is formed on an outer side of the circuit pattern areas 20A and 20B to surround them. As shown in FIG. 3B, a rectangular slit illumination area formed on the reticle R is a slit illumination area 21 having a width L2 along the scan line where the width L2 is larger than the width L1 of the light shielding area 20C.

An operator first enters information on the circuit pattern areas 20A and 20B on the reticle R into the memory unit 17 through the input unit 16 of FIG. 1. When the first circuit pattern area 20A is to be transferred onto the wafer W through the projection optical system 13, the main control unit 12 reads the information on the circuit pattern area 20A in the input information stored in the memory unit 17 and controls the position of the scan of the light shielding plates 8A and 8B through the light shielding plate control unit in accordance with the read information. As a result, the second circuit pattern 20B on the reticle R is shielded and the illumination light of the slit illumination area 21 is projected to only the first circuit pattern area 20A as shown in FIG. 3B.

In the exposure mode, the main control unit 12 of FIG. 1 drives the reticle stage 9 through the reticle stage drive unit 10 to position the slit illumination area 21 at the upper right side of the circuit pattern area 20A on the reticle R, and drives the reticle stage 9 to integrally move the reticle R and the light shielding plates 8A and 8B along the scan line (X axis) so that it passes under the illumination area 21. In synchronism therewith, the main control unit 12 drives the wafer stage 14 through the wafer stage drive unit 15 to drive the wafer W along the scan line (-X axis). In this case, since the illumination light is projected to only the first circuit pattern area 20A on the reticle R, only the pattern of the first circuit pattern area 20A is transferred onto the wafer W.

When the pattern of the second circuit pattern area 20B on the reticle R is to be transferred onto the wafer W, the main control unit 12 reads the information on the second circuit pattern area 20B in the input information stored in the memory unit 17, and controls the position of the scan of the light shielding plates 8A and 8B through the light shielding plate drive unit 11 in accordance with the read information. As a result, as shown in FIG. 3C, the first circuit pattern area 20A on the reticle R is shielded by the light shielding plate 8A and the illumination light of the slit illumination area 21 is projected only to the second circuit pattern area 20B.

In the exposure mode, the main control unit 12 of FIG. 1 drives the reticle stage 9 through the reticle stage drive unit 10 to position the slit illumination area 21 at the upper right side of the second circuit pattern area 20B on the reticle R, and drives the reticle stage 9 to integrally move the reticle R and the light shielding plates 8A and 8B along the X axis so that it passes under the illumination area 21. In synchronism therewith, the main control unit 12 drives the wafer stage 14 through the wafer stage drive unit 15 to move the wafer W in -X direction. In this case, since the illumination light is projected to only the second circuit pattern area 20B on the reticle R, only the pattern of the second circuit pattern area 20B is transferred onto the wafer W.

In accordance with the present embodiment, since the areas other than the circuit pattern areas to be exposed are shielded by the light shielding plates 8A and 8B which serve as the reticle blind, only the pattern of the desired circuit pattern area can be exposed onto the wafer W even if the plurality of circuit pattern areas are formed on the reticle at a narrow interval along the scan direction. Accordingly, a plurality of circuit pattern areas may be formed on the reticle at a narrow interval.

In the present embodiment, the light shielding plates 8A and 8B are integrally driven with the reticle R. Alternatively, separate drive means for driving the light shielding plates 8A and 8B along the scan direction in synchronism with the reticle R may be provided. In this case, however, a high drive speed of the light shielding plates 8A and 8B is required because the reticle stage 9 of FIG. 1 may be driven at a high speed of 100 mm/sec or higher in the scan and exposure mode. As shown in FIG. 2 of the present embodiment, when the reticle R and the light shielding plates 8A and 8B are mounted on the reticle stage 9 to integrally move the reticle R and the light shielding plates 8A and 8B, separate drive means for the light shielding plates 8A and 8B is not necessary and the synchronism of the movement of the reticle R and the light shielding plates 8A and 8B is superior.

In the present embodiment, two circuit pattern areas are formed on the reticle R. The projection exposure apparatus of the present embodiment may be applicable to an application where three or more circuit pattern areas are provided on the reticle R.

Figure 4A:
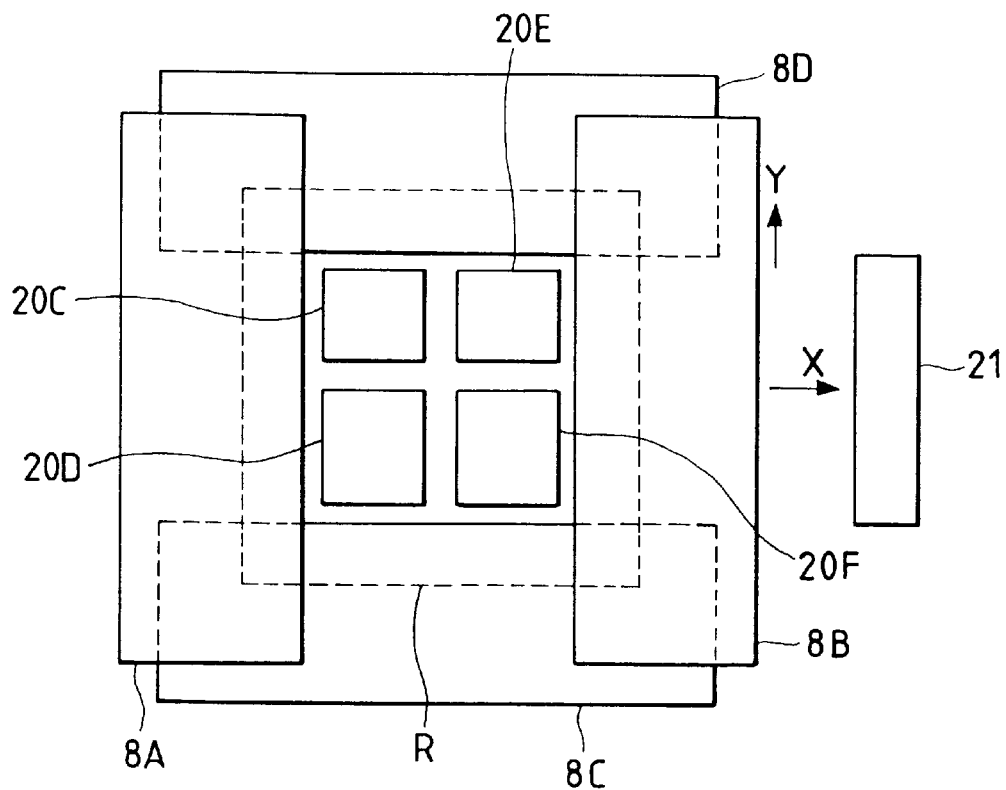
FIG. 4A shows a plan view when four light shielding plates are used.

In this connection, as shown in FIG. 4A, where two light shielding plates 8C and 8D which are movable along the non-scan direction (Y axis) which is perpendicular to the scan direction are provided in addition to the light shielding plates 8A and 8B along the scan direction as shown in FIG. 4A, only the pattern of the desired circuit pattern area can be exposed to the wafer W even if a plurality of circuit pattern areas are formed on the reticle R along the non-scan direction. Namely, where four light shielding plates 20C to 20F are formed with the separation along the X axis and the Y axis on the reticle R, the illumination light may be projected to any one circuit pattern area of the four circuit pattern areas 20C to 20F by independently adjusting the positions of the four light shielding plates 8A to 8D. By integrally scanning the reticle R and the light shielding plates 8A to 8D relative to the slit illumination area 21 along the X axis, the pattern of the selected circuit pattern area on the reticle R may be exposed to the wafer W.

Figure 4B:
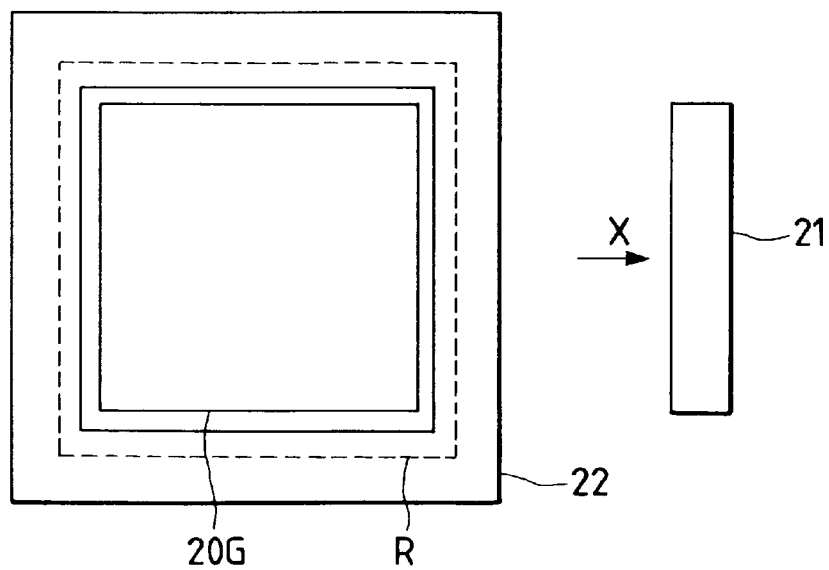
FIG. 4B shows a plan view when the light shielding plates are fixed.
Figures 5A, 5B:
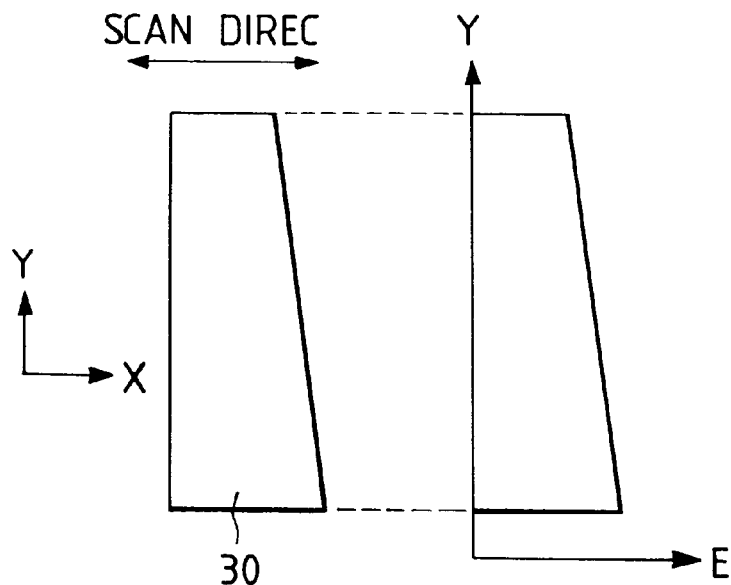
FIGS. 5A and 5B show an example in which the shape precision of a slit illumination area along the scan direction affects to the uniformity of illumination after the scan.
Figures 6A, 6B:
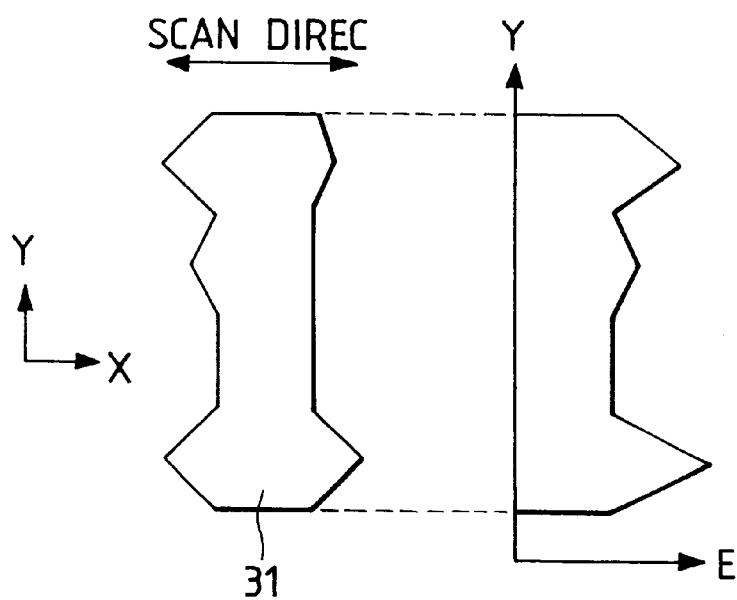
FIGS. 6A and 6B show another example in which the shape precision of a slit illumination area along the scan direction affects to the uniformity of illumination after the scan.

As shown in FIG. 4B, where only one circuit pattern area 20G is formed on the reticle R, the light shielding plate which serves as the reticle blind to shield a portion of the illumination area on the reticle R along the scan direction may be the light shielding plate 22 fixed on the reticle stage. In this case, the control unit for changing the range of light shield by the light shielding plate 22 is not necessary. Where such fixed light shielding plate 22 is provided, the sensitization of the wafer be the leakage of the illumination light from the periphery of the reticle R at the start or end of the slit scan exposure is prevented.

In the present embodiment, the light shielding plates 8A and 8B are moved as the reticle R is driven. In any case, the light shielding plates 8A and 8B may be moved such that the openings thereof always coincide with the circuit pattern area on the reticle R which is to be exposed. For example, where the reticle R and the wafer W are fixed and the exposure is made while the slit illumination area is scanned relative to the reticle R, it is not necessary to move the light shielding plates 8A and 8B during the exposure. Further, the shape of the slit illumination area, that is, the shape of the opening of the view field diaphragm 6 is not limited to the rectangle but it may be hexagonal as disclosed in Japanese Patent Publication No. 46-34057 and U.S. Pat. No. 4,924, 257, or it may be of diamond shape as disclosed in Japanese Patent Publication No. 53-25790, or it may be arcuate as disclosed in U.S. Pat. No. 4,747,678.

The projection optical system 13 in the present embodiment may be a diffraction type, a reflection type or a reflection-diffraction type. The present invention is not limited to the projection exposure apparatus but it may be applicable to an exposure apparatus of a contact type or a proximity system. The present invention is not limited to the above embodiment but various modifications thereof may be made without departing from the spirit of the present invention.

In accordance with the present invention, since the light shielding means for shielding the area on the mask which is not to be illuminated is provided, the illumination area defining means for defining the slit illumination area on the mask may be arranged at the spaced position from the mask in the illumination optical system. Accordingly, the width of the illumination area defining means along the scan direction may be controlled at a high precision, and the uniformity of illumination on the photosensitive substrate after the scan and exposure can be maintained at a high level. Even when a plurality of pattern areas are formed on the mask along the scan direction at a narrow interval, only the pattern of the desired pattern area can be exposed to the photosensitive substrate.

Where the auxiliary scan means for scanning the light shielding means in synchronism with the scan of the mask by the relative scan means is provided, it is not necessary to control the status of the opening of the light shielding means during one scan cycle and the control of the status of the opening of the light shielding means is facilitated.

Where the relative scan means is shared by the auxiliary scan means and the relative scan means integrally scan the mask and the light shielding means, it is not necessary to additionally provide the drive means for scanning the light shielding means.

Further, where the light shielding means shields the predetermined fixed area on the mask, the mechanism for controlling the status of the opening of the light shielding means is not necessary and the construction is simplified.

Referring now to FIGS. 8 to 10A and 10B, another embodiment of the present invention is explained. In the present embodiment, the present invention is applied to a scanning projection exposure apparatus which uses a pulse oscillation type exposure light source such as an excimer laser light source.

FIG. 8 shows a projection exposure apparatus of the present embodiment. In FIG. 8, a sectional shape of a laser beam emitted from a light source 101 of a pulse oscillation type is shaped by a beam shaping optical system 102 including a cylindrical lens and a beam expander so that it is directed to a fly eye lens 104 with a high efficiency. The laser beam emitted from the beam shaping optical system 102 is directed to dimmer means 103 which includes a coarse transmission adjuster and a fine transmission adjuster. The laser beam emitted from the dimmer means 105 is directed to the fly eye lens 104.

The fly eye lens 104 illuminates a view field diaphragm 107 and a reticle R with a uniform illumination. The laser beam emitted from the fly eye lens 104 is directed to a beam splitter 105 having a small reflection coefficient and a small transmission, and the laser beam transmitted through the beam splitter 105 illuminates the view field diaphragm 107 through a first relay lens 106 with a uniform illumination. The shape of the opening of the view field diaphragm 107 in the present embodiment is rectangular.

The laser beam transmitted through the view field diaphragm 107 passes through a second relay lens 108, a deflection mirror 109 and a main condenser lens 110 and illuminates the reticle R on a reticle stage 111 with a uniform illumination. The view field diaphragm 107 and the pattern formation plane of the reticle R are conjugate and the laser beam is projected to a rectangular slit illumination area 126 on the reticle R which is conjugate with the opening of the view field diaphragm 107. The shape of the slit illumination area 126 may be adjusted by changing the shape of the opening of the view field diaphragm 107 as it is in U.S. Pat. No. 5,194,893.

An image of a pattern in the slit illumination area on the reticle R is exposed onto the wafer W through a projection optical system 116. Assuming that Z axis is parallel to an optical axis of the projection optical system 116 and X axis represents the scan direction of the reticle R relative to the slit illumination area 126 in a plane normal to the optical axis, the reticle stage 111 is scanned along the X axis by a reticle stage drive unit 113 which is controlled by an arithmetic and logic unit 115 operated by a main control unit 114 which controls the overall operation of the apparatus.

On the other hand, the wafer W is mounted on an XY stage 118 which can be scanned along at least X axis (lateral in FIG. 8) through a wafer holder 117. While not shown, a Z stage for positioning the wafer W along the Z axis is mounted between the XY stage 118 and the wafer holder 117. In the scan and exposure mode, the wafer W is scanned along the −X axis through the XY stage 118 in synchronism with the scan of the reticle R along the X axis but the XY stage 118 is driven by a wafer stage drive unit 119.

A photoelectric detector 120 is mounted on the XY stage 118. In the present embodiment, the shape of the slit exposure area 126P which is conjugate with the slit illumination area 126 on the reticle is measured by using the photoelectric detector 120. As disclosed in U.S. Pat. No. 4,465,368, the photoelectric detector 120 is also used to measure the uniformity of the illumination of the laser beam which serves as the exposure light on the XY stage 118. An integration of a pin hole formed at the same level as the surface of the wafer W and a photo-diode, a PIN photo-diode or a photo-multiplier arranged below the pin hole may be used as the photoelectric detector 120. In order to measure the shape of the slit exposure area 126P, a linear array sensor or a two-dimensional array sensor may be used as the photoelectric detector 120. The photoelectrically converted signal from the photoelectric detector 120 is sent to the arithmetic and logic unit 115 through an amplifier 121.

The laser beam reflected by the beam splitter 105 is sensed by an exposure intensity monitor 122 which includes a photoelectric conversion element, and a photoelectrically converted signal of the exposure intensity monitor 122 is supplied to the arithmetic and logic unit 115 through an amplifier 123. As will be explained later, the arithmetic and logic unit 115 determines the shape of the slit exposure area 126P by using the photoelectric detector 120 and adjusts the shape of the opening of the view field diaphragm 107 through the drive unit 112 based on the measurement or adjusts the scan velocity of the reticle R and the wafer W relative to the slit illumination area 126. The measurement of the shape of the slit exposure area 126P is supplied to the main control unit 114 which controls an output power of the light source 101 as required or controls the transmission in the dimmer means 103. The operator may enter the pattern information of the reticle R to the main control unit 114 through the input/output means 124, and the main control unit includes a memory 125 for storing various information.

An exposure operation in the present embodiment is now explained. Before the exposure, a reticle (for measuring the illumination shape) having an opening through which the light of the slit illumination area 126 is to be passed is defined as the reticle R, and the reticle R is positioned through the reticle stage 111 such that the opening of the reticle is positioned under one edge of the slit illumination area 126. Instead of using such reticle for measuring the illumination shape, a conventional reticle with an opening for the measurement may be used. The opening of the reticle need not be larger than the slit illumination area 126 and it is sufficient if it is larger than the dimension of the sense area of the photoelectric detector 120 on the XY stage 118 (the dimension of the pin hole when it is provided), converted to the equivalent reticle surface area.

If the uniformity of the illumination on the wafer W in a static state without scan is maintained, the reticle stage 111 may be positioned along the scan direction such that the opening on the reticle coincides with one edge of the slit illumination area 126. The reticle having such opening formed therein is to be inserted because the optical length may vary without such reticle and the conjugate relationship between the view field diaphragm 107 and the surface of the wafer W is shifted. Where the opening on the reticle is relatively large, the slit exposure area 126P in the projection image of the opening on the reticle is scanned along the X direction by the photoelectric detector 120 through the XY stage 118 while the reticle stage 111 is fixed.

Figure 9:
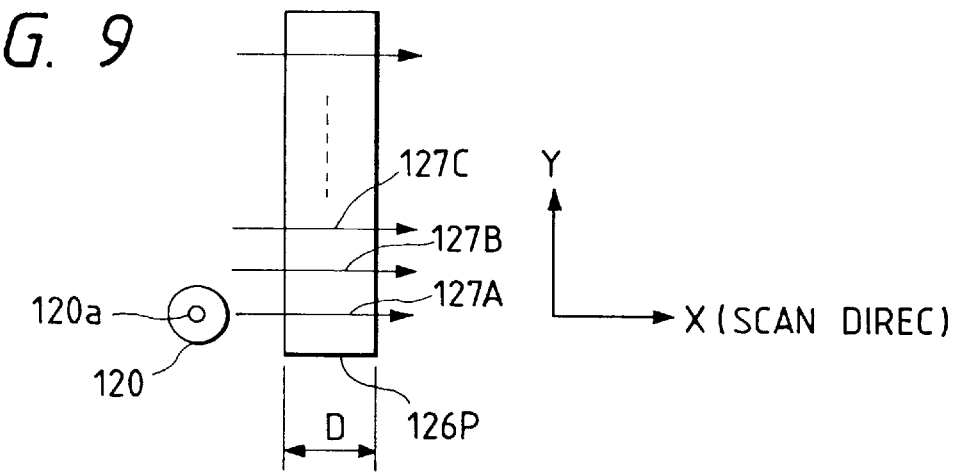
FIG. 9 shows a plan view for illustrating the measurement of a width of a slit exposure area 126P along the scan direction.
Figure 10A:
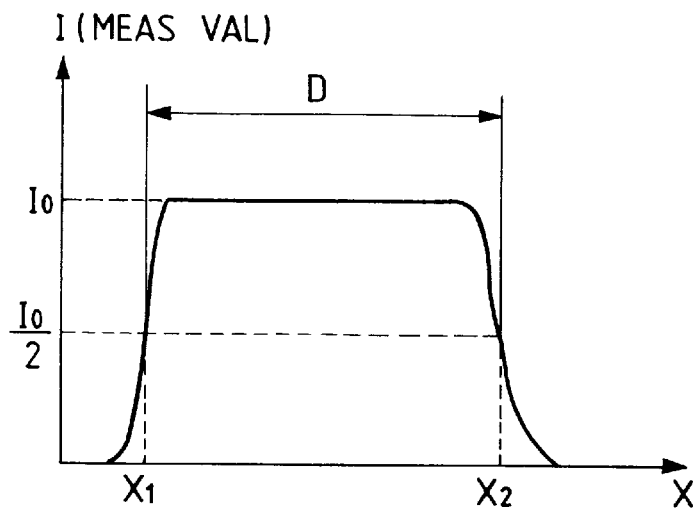
FIG. 10A shows a waveform of a photoelectrically converted signal produced when the width of the slit exposure area is measured.
Figure 10B:
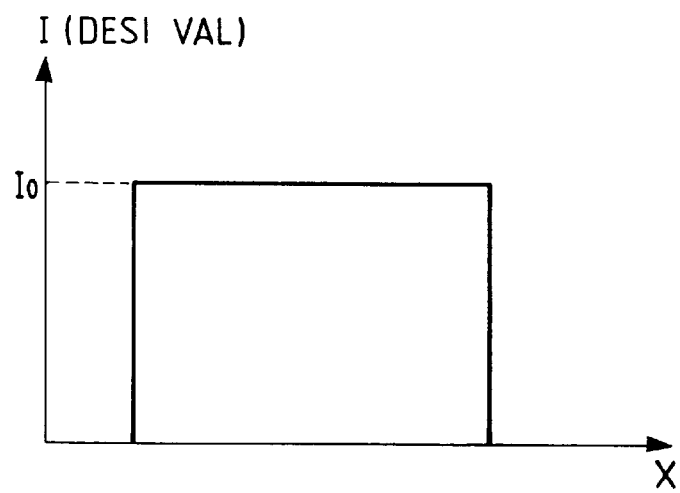
FIG. 10B shows a waveform of a design value of the photoelectrically converted signal produced when the width of the slit exposure area is measured.
Figure 11A:
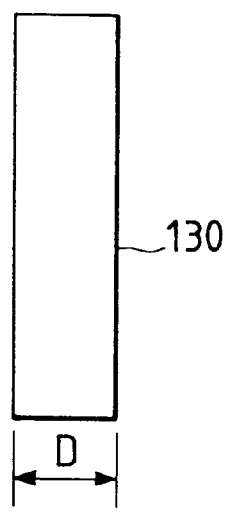
FIGS. 11A to 11D show plan views of various examples of conjugate images (slit exposure areas) of the slit illumination area on the photosensitive substrate.
Figure 11B:
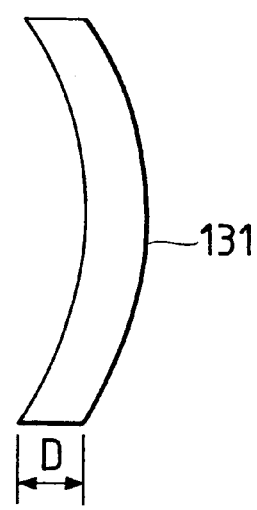
Figure 11C:
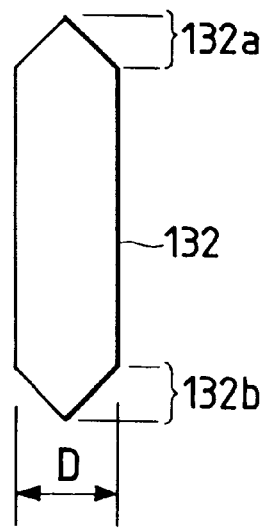
Figure 11D:
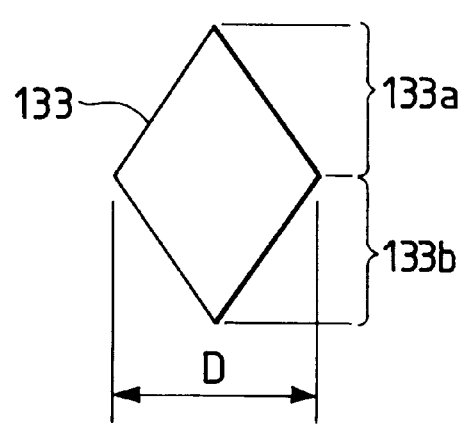

FIG. 9 shows a scan method of the photoelectric detector 120 to the slit exposure area 126P. In FIG. 9, a photosensing element 120A of the photoelectric detector 120 is scanned to the slit exposure area 126P along a locus 127A in the X axis to measure the position of the edge of the exposure area 126P along the scan line. For example, the width W of the slit exposure area 126P is measured along loci 127A, 127C, . . . defined at a predetermined interval along the Y axis normal to the X axis to measure the shape of the slit exposure area 126P even if it is arcuate.

Where the excimer laser light source is used as the light source 101 of the present embodiment, the excimer laser light source is of pulse oscillation type and it emits light by a light emission trigger supplied from the main control unit 114. A position information output from a length measurement device (for example, a laser interferometer), not shown, which monitors the position of the XY stage 118 in synchronism with the light emission trigger, and an output signal of the photoelectric detector 120 through the amplifier 121 are supplied to the arithmetic and logic unit 115. Where a variance of the pulsive light emission energy of the excimer light source is large, the output signal of the photoelectric detector 120 may be divided by the output signal of the exposure intensity monitor 122 to compensate for the variance of the energy.

The photoelectrically converted signal I produced from the photoelectric detector 120 when the slit exposure area 126P is scanned by the photoelectric detector 120 along the X axis is rectangular in design as shown in FIG. 3B. In actual, however, it is a waveform as shown in FIG. 3A due to a setting error of the view field diaphragm 107 and an aberration of the illumination optical system. Thus, a position $X_1$ along the X axis when the photoelectrically converted signal I is sliced at a ½ level of maximum value $I_0$ of the photoelectrically converted signal I is taken as one edge of the slit exposure area 126P.

Similar measurement is made while the photoelectric detector 120 is moved to the vicinity of the other edge of the slit exposure area 126P. Where the laser beam in the slit illumination area 126 is shielded by the light shielding pattern of the reticle, the opening on the reticle is moved immediately beneath the other edge of the slit illumination area 126. Then, the reticle is stopped and the photoelectric detector 120 is scanned to measure the position of the other edge of the slit exposure area 126P. A position $X_2$ of the other edge is determined based on the measurement. A width D of the slit exposure area 126P along the scan line is determined based on a difference between the position $X_1$ and the position $X_2$.

If the opening on the reticle is smaller than the edge area of the slit exposure area 126P shown in FIG. 3A, the reticle stage 111 is to be synchronously scanned as well in addition to the wafer stage 118 when the position $X_1$ and the position $X_2$ are measured.

If the opening of the view field diaphragm 107 is movable by the drive unit 112, it is necessary to check the uniformity of the width D along the non-scan direction (Y axis) because, if the width D is not uniform along the non-scan direction, the uniformity of the illumination on the wafer W after the exposure by the scan exposure system would be lost. Thus, it is necessary to measure the width D by the photoelectric detector 120 at two or more points, for example, at three points, a center and the opposite ends of the exposure area 126P as shown in FIG. 9. If the uniformity of the width of the opening of the view field diaphragm 107 along the scan direction is not sufficiently high, fine adjustment is made by the drive unit 112 to attain the parallelism of the view field diaphragm.

Where the photoelectric detector 120 is not of pin hole type but is a linear array sensor arranged along the Y axis, the measurement along the non-scan direction may also be done in one scan and measurement cycle but it is necessary to form a large opening in the reticle along the Y axis which is conjugate with the photosensor of the array sensor. Where the photoelectric detector 120 is a two-dimensional array sensor and the area thereof is larger than the slit exposure area 126P, the shapes of the slit exposure area 126P along the scan direction and the non-scan direction may be measured in one static state measurement but it is necessary to form a larger opening in the reticle.

If the view field diaphragm 107 is of fixed type which is well pre-adjusted, the width D of the slit exposure area 126P may be measured occasionally to monitor the change by aging and the apparatus constant in the memory unit 125 may be modified based on the measurement. Where the parallelism of the opposite edges of the slit exposure area 126P is assured, it is sufficient to measure the width D at one point along the non-scan direction.

In FIG. 8, after the width D of the slit exposure area 126P along the scan direction measured in the manner described above has been stored in the memory unit 125, the reticle R for the exposure is mounted on the reticle stage 111 and the wafer W for the exposure is mounted on the wafer holder 117, and the actual exposure operation is started. The operator first enters a proper exposure intensity for the wafer W to the main control unit 114 from the input/output means 124, and the proper exposure intensity is sent to the arithmetic and logic unit 115. Then, the illumination of the exposure plane of the wafer W is measured. The illumination of the exposure plane of the wafer W may be measured by an exposure intensity monitor 122 which is well correlated to a pulse energy P (mJ/cm$^2$·pulse) on the exposure plane of the wafer W, or by using an output signal of the photoelectric detector 120 on the XY stage 118.

When the measurement of the pulse energy P of the pulse laser beam from the light source 101 is completed, parameters for controlling the exposure intensity are determined in the following manner. In the following description, it is assumed for the sake of simplicity that the variance of the pulse energy P is sufficiently low and the pulse energy P may be considered as a constant value. Assuming that f (Hz) represents the oscillation frequency of the light source 101, the illumination I (mW/cm$^2$) on the exposure plane of the wafer is given by:

$$I = P \cdot f \qquad (2)$$

The number N of pulses required for the exposure is given by:

$$N = f \cdot t \qquad (3)$$

where t (sec) represents the exposure time. From the formulas (2) and (3), $$N = S/P = Df/v \qquad (4)$$

where S (mJ/cm$^2$) represents the proper exposure intensity on the wafer, and v (mm/sec) represents the scan velocity of the reticle and the wafer converted to that on the exposure plane of the wafer.

It is seen from the formula (4) that it is necessary to control such that S/P and Df/v are integers. The more the values of S/P and Df/v deviate from integers, the more are the uniformity of the illumination on the wafer after the exposure by the scan exposure and the precision of control of the exposure intensity deteriorated. In order to render S/P to an integer, the pulse energy P is finely controlled. This is done by finely adjusting the transmission of the dimmer means 103 of FIG. 8.

On the other hand, in order to render Df/v of the formula (4) to an integer, it is necessary to finely adjust the width W of the slit exposure area 126P, the oscillation frequency f or the scan velocity v. Where the width D is to be adjusted, the view field diaphragm 107 is finely adjusted by the drive unit 112. If the precision of the fine adjustment is not sufficiently high, it is necessary to re-measure the width D of the slit exposure area 126P. Where the oscillation frequency f or the scan velocity v is to be adjusted, it is adjusted such that it is within the variable range.

In the above description, it has been assumed that the variance of the pulse energy P of the excimer laser light source is sufficiently small. In actual, however, the excimer laser light source has a variance of approximately 5% (three times of a standard deviation σ). Assuming that PB represents a mean value of the pulse energy and ΔP represents the variance of the pulse energy P, the variance of the pulse energy P is represented by ΔP/PB. If a reproduction precision A of the exposure intensity is to be within 1% (3σ), it is necessary that the number N of pulse of the formula (4) should meet the following relation:

$$N \geq \{(\Delta P/PB)/A\}^2 = 25 \qquad (5)$$

If the proper exposure intensity S is small, it is necessary to reduce the pulse energy P in the formula (4) and the transmission is adjusted by the coarse adjustment unit in the dimmer means 103 in accordance with a command from the main control unit 114. After the parameters relating to the exposure given by the formula (4) have been determined, the reticle R and the wafer W are synchronously scanned at the velocity v converted to that of the wafer plane and the light source 101 is oscillated at the frequency f so that the exposure intensity of the wafer W is controlled to the desired one with the desired uniformity of illumination and the desired precision of control of the exposure intensity.

In the present embodiment, it is assumed that the pulsive light source such as an excimer laser light source is used as the light source. Where a g-ray or an i-ray is taken from a continuous light source such as a mercury lamp for use as the exposure light, the beam shaping optical system 102 of FIG. 8 comprises a collimator lens and an interference filter. The condition for setting the parameters relating to the exposure of the formula (4) is represented by the formula (1), and the illumination I on the exposure plane of the wafer, the width D of the slit exposure area and the scan velocity v may be adjusted in accordance with the proper exposure intensity S.

Where the exposure light source is the continuous light source, the dimmer means 103 of FIG. 8 is usually not essential and the adjustment may be made by the scan velocity v and the width D such that the scan velocity v is reduced for a large exposure intensity and the scan velocity v is increased for a small exposure intensity. When the scan velocity v reaches a maximum velocity permitted to the apparatus, it is necessary to reduce the width D of the slit exposure area. While it is assumed that the view field diaphragm 107 is arranged in the plane which is conjugate with the pattern plane of the reticle R in the illumination optical system, it may be arranged closely to the reticle R.

The projection optical system in FIG. 8 may be of diffraction type, reflection type or reflection-diffraction type. The present invention is not limited to the projection exposure apparatus but it is equally applicable to a contact type or proximity type exposure apparatus.

In accordance with the present invention, since the width of the area corresponding to the slit illumination area along the scan direction may be measured on the plane of the photosensitive substrate, the exposure with the proper exposure intensity can be attained to the photosensitive substrate by using the measured width. The uniformity of illumination on the photosensitive substrate is also improved.

In the exposure apparatus of the present invention, where the measurement means is shared by the photoelectric detection means for measuring the uniformity of illumination on the stage of the illumination light from the illumination optical system, the configuration of the apparatus may be simplified.

Where the correction means for correcting the width of the slit illumination area along the scan direction based on the width of the slit illumination area on the photosensitive substrate along the scan direction measured by the measurement means, the width of the slit illumination area may be precisely set to the desired width.

Figure 12:
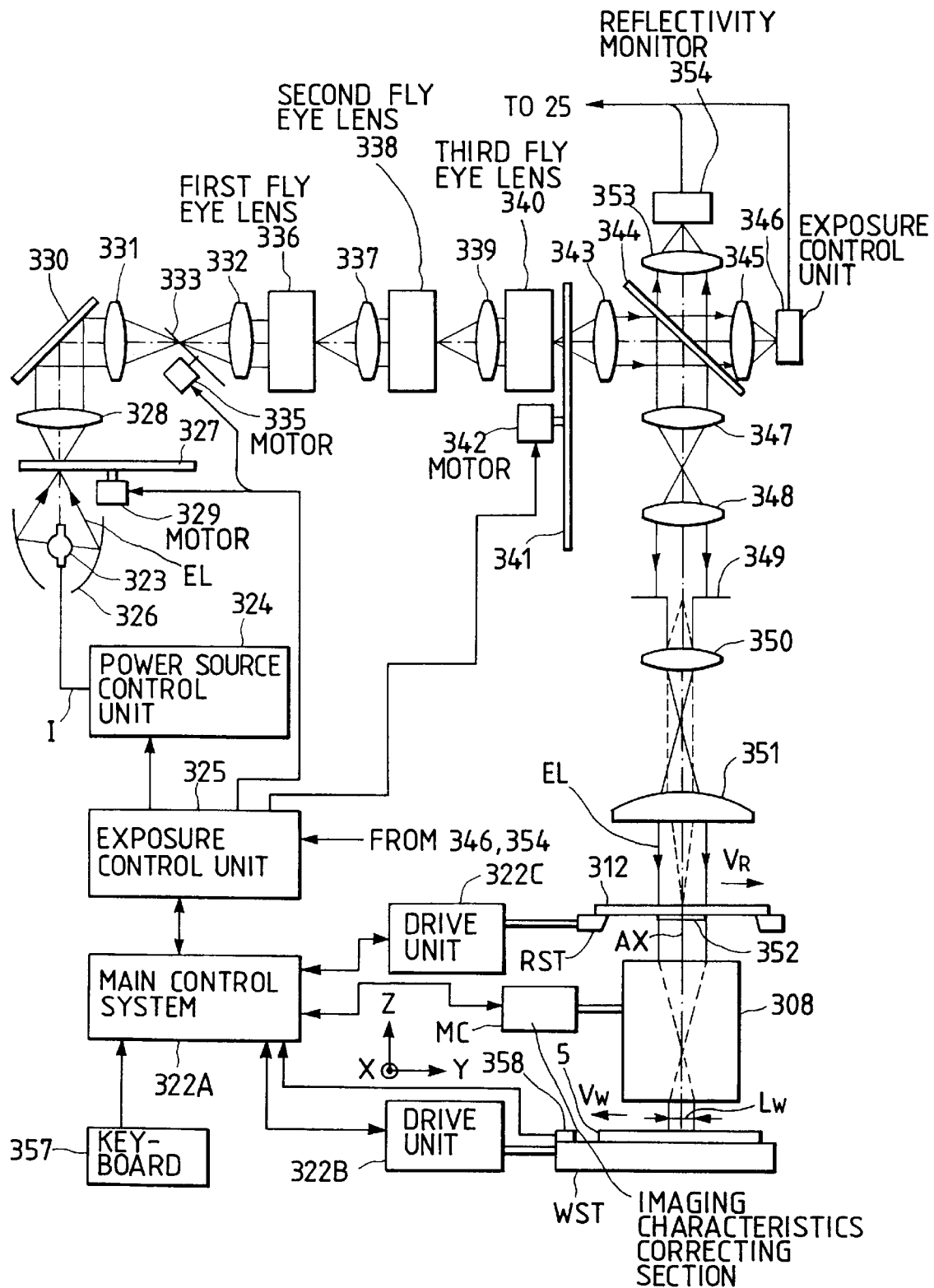
FIG. 12 shows the whole structure of a scanning type projection exposure apparatus according to a third embodiment of the present invention.

A third embodiment of the present invention will be described with reference to FIGS. 12 to 15A and 15B. In this embodiment, the present invention is applied to a scanning type projection exposure apparatus with a light source for emitting continuous light. FIG. 12 shows the whole structure of the scan and projection type exposure apparatus of this embodiment and FIG. 13 shows the structure of the stage system in FIG. 12.

Figure 13:
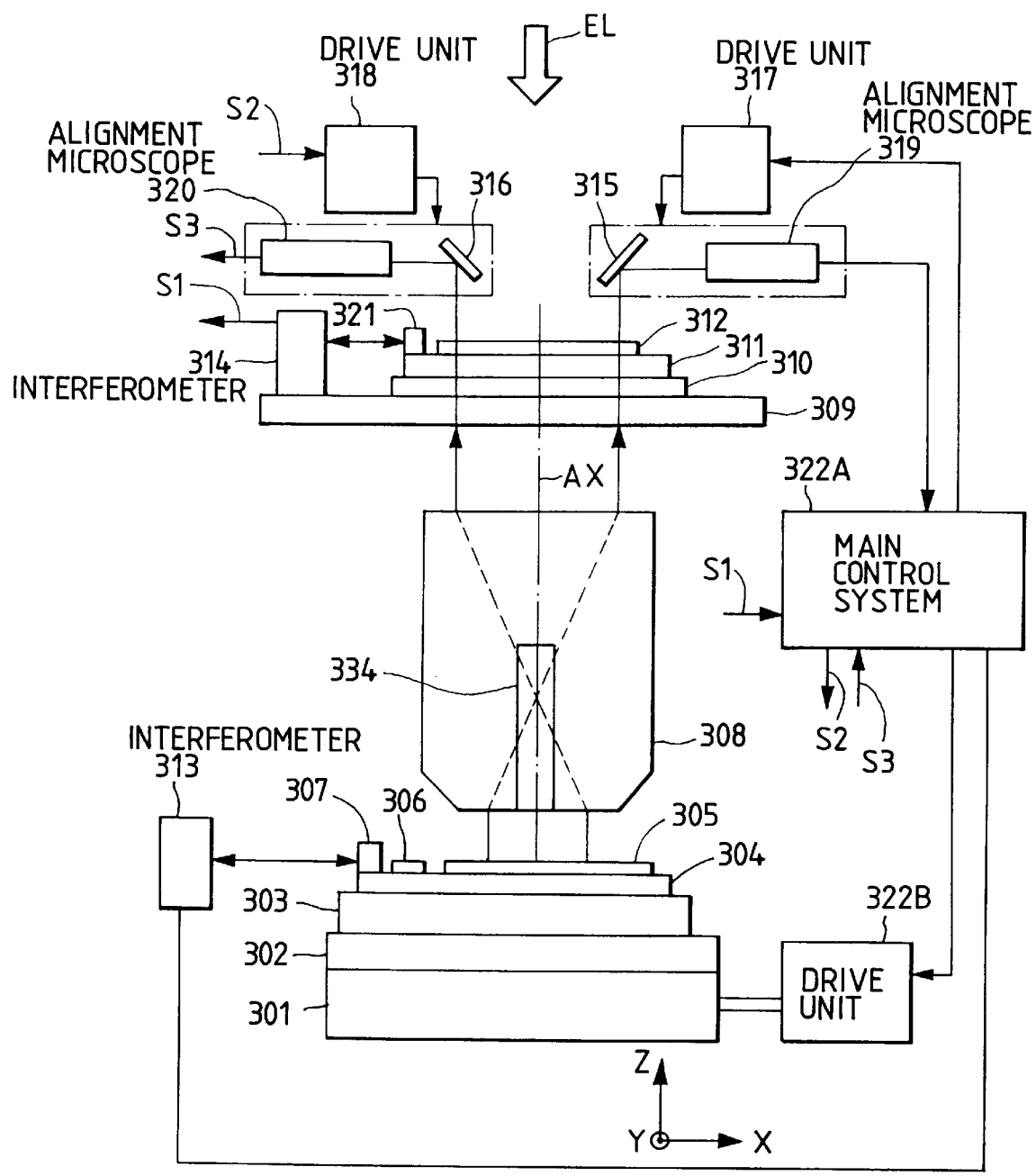
FIG. 13 shows the structure of the stage system of the apparatus in FIG. 12.

In FIG. 13, light EL from an illumination optical system illuminates only a local illumination area (e.g., a rectangular area elongated in the X direction) on a reticle 312. The light EL transmitted through the reticle 312 enters a projection optical system 308 which is telecentric on both sides. The projection optical system 308 projects a part of the image of the pattern on the reticle 312 within the illumination area on a wafer 305 with a photoresist applied thereon. In the apparatus of FIG. 13, if the magnification of the projection optical system 308 is β, the reticle 312 is shifted in the Y direction (direction perpendicular to the paper) perpendicular to the optical axis AX of the projection optical system 308 at a constant speed $V_R$ while the wafer 305 is shifted in the Y direction at a constant speed $V_W$ ($=\beta \cdot V_R$) in synchronism with the movement of the reticle 312. Thereby, the light EL illuminates the whole surface of the pattern of the reticle 312 and the image of the pattern is scanned and exposed on the wafer 305. In this embodiment, as the projection optical system 308 is constituted of only a plurality of refracting elements, the reticle 312 and the wafer 305 are shifted each other in the opposite directions along the Y direction.

A roughly shiftable stage 310 is disposed on a base 309 and a minutely shiftable stage 311 is disposed on the roughly shiftable stage 310. The reticle 312 is supported on the minutely shiftable stage 311 by a vacuum chuck or the like. The roughly shiftable stage 310 can be shifted only in the Y direction and is driven so as to shift the reticle 312 at the constant speed in the Y direction when scanning the image of the pattern of the reticle 312 and exposing it on the wafer 312. The minutely shiftable stage 311 can be shifted slightly in a plane perpendicular to the optical axis AX of the projection optical system 308, i.e., can be shifted slightly in the X and Y directions and the direction of rotation (θ direction). It is possible to position the reticle 312 precisely by the minutely shiftable stage 311. The roughly shiftable stage 310 and the minutely shiftable stage 311 are driven by a drive unit 322C (see FIG. 12) independently of each other. A movable mirror 321 is disposed on the minutely shiftable stage 311 to reflect a laser beam from an interferometer 314 on the base 309. The interferometer 314 constantly detects the position of the minutely shiftable stage 311 in the X and Y directions and the deviation (amount of rotation) thereof in the θ direction. The position information S1 from the interferometer 314 is supplied to a main control system 322A.

In the meantime, a Y stage 302 shiftable in the Y direction is disposed on a base 301 and an X stage 303 shiftable in the X direction is disposed on the Y stage 303. On the X stage 303 is further disposed a Z stage 304 slightly shiftable in the Z direction. The wafer 305 is supported by the Z stage via a slightly rotatable wafer holder (θ table). The X, Y and Z states 302 to 304 are driven by a drive unit 322B independently of each other. A movable mirror 307 is mounted on the Z stage 304. An interferometer 313 constantly detects the position of the Z stage 304 in the X and Y directions and the deviation (amount of rotation) thereof in the θ direction. The position information from the interferometer 313 is supplied to the main control system 322A. The main control system 322A determines the positions of the wafer 305 and the reticle 312 via the drive units 322B and 322C and controls the movements thereof at the time of the scanning exposure. In addition, the main control system 322A controls the operation of the whole apparatus.

A reference mark plate 306 is fixed on the Z stage 304 in the vicinity of the wafer 305 so as to make the rectangular coordinate system defined by the interferometer 313 correspond to the rectangular coordinate system defined by the interferometer 314. Various reference marks are provided on the reference mark plate 306. For these marks, there are, e.g., light transmitting type marks as disclosed in U.S. Pat. No. 4,853,745, which are illuminated from the back surface of the reference mark plate 306 with light having approximately the same wavelength as the light EL and being led under the reference mark plate 306.

In this embodiment (FIG. 13), above the reticle 312 are provided two sets of alignment microscopes 319 and 320 for detecting the reference marks on the reference mark plate 306 and marks on the reticle 312. The information detected by the alignment microscopes 319 and 320 is supplied to the main control system 322A. Mirrors 315 and 316 are disposed movably so as to lead lights from the marks on the reticle 312 to the alignment microscopes 319 and 320. Upon starting an exposure sequence, the mirrors 315 and 316 are withdrawn from the light path by drive units 317 and 318 so as not to shield the light EL in accordance with the instructions from the main control system 22A.

Further, in FIG. 13, e.g., as disclosed in U.S. Pat. No. 4,962,318, an off-access type alignment unit 334 is provided independently of the projection optical system 308 to detect the alignment marks on the wafer 305.

Next, the structures of the illumination optical system and the control system of the projection exposure apparatus of this embodiment will be described.

In FIG. 12, when a predetermined voltage is applied by a power source control unit 324, a mercury lamp 323 as the light source emits light. While a predetermined current is supplied, the mercury lamp 323 continues emitting light (e.g., i-lines with the wavelength of 365 nm) with constant brightness. In this embodiment, by changing the current I supplied from the power source control unit 324 to the mercury lamp 323 continuously within a predetermined range, the illuminance (intensity) of the light emitted from the mercury lamp 323 is changed continuously within a predetermined range. Also, an exposure control unit 325 which controls an amount of exposure for the wafer 305 to an optimum amount in accordance with the sensitivity of the photoresist controls the operation of the power source control unit 324.

The light from the mercury lamp 323 is condensed by an elliptical mirror 326. Thereafter, the light passes a rotatable light reducing filter plate 327, a lens 328, a mirror 330 and is condensed again by a lens 331 to form an image of the light source. At this position, a shutter 333 is disposed so as to open or close the light path.

The exposure control unit 325 sets the angle of rotation of the rotatable light reducing filter plate 327 via a motor 329. FIG. 14 shows the structure of the rotatable light reducing filter plate 327. In FIG. 14, the light reducing filter plate 327 is a circular disk formed with six circular openings at regular intervals. Light reducing filters 327a to 327f having different transmittances with respect to the light are fitted in the respective openings. For example, the transmittance of the light reducing filter 327a is 100% and the transmittances of the light reducing filters 327b to 327f are decreased in stages in that order. Therefore, the illuminance of the light can be varied in stages by adjusting the angle of rotation of the light reducing filter plate 327 and positioning one of the light reducing filters 327a to 327f in the light path.

Referring to FIG. 12 again, the exposure control unit 325 controls the operation of opening or closing the shutter 333 via a motor 335. When the shutter 333 is in the opened state, the light passing the shutter 333 becomes approximately a flux of parallel rays by means of a first input lens 332 and is incident on a first fly eye lens 336. A plane illuminant image (a plane in which a plurality of secondary light sources corresponding to respective elements of the first fly eye lens 336 are collected) is formed in the rear focal surface of the first fly eye lens 336. The light emanated from the first fly eye lens 336 becomes approximately a flux of parallel rays by means of a second input lens 337 and is incident on a second fly eye lens 338 to form a plurality of third light sources in the rear focal surface of the second fly eye lens 338. The light emanated from the second fly eye lens 338 becomes approximately a flux of parallel rays by means of a third input lens 339 and is incident on a third fly eye lens 340 to form a plurality of fourth light sources in the rear focal surface of the third fly eye lens 340.

The respective rear (the reticle side) focal surfaces of the first to third fly eye lenses 336, 338 and 340 coincide approximately with Fourier transform planes in the illumination optical system with respect to the pattern formed surface of the reticle 312. Also, the exit side plane (accurately the rear focal surface) of the first fly eye lens 336 and the incident side plane of the second fly eye lens 338 are in the Fourier transform form. Further, the exit side plane (the rear focal surface) of the second fly eye lens 338 and the incident side plane of the third fly eye lens are in the Fourier transform relation.

In the rear focal surface of the third fly eye lens 340, not only the surface illuminant image (the surface in which the plurality of fourth light sources are collected) is formed, but also a stop member 341 is disposed to define the shape and size of the surface illuminant image. The stop member 341 includes a turret plate (or a slider) formed with a plurality of aperture stops whose openings have different shapes and sizes. Therefore, in accordance with types of reticle patterns, it is possible to change the illuminance distribution of the light in the Fourier transform planes in the illumination optical system. In this embodiment, e.g., as introduced in "SPIE Optical/Laser Microlithography V" (Vol. 1674, Pub. 1992), the stop member 341 is provided with four openings having respective centers disposed at the equal distances from the optical axis, i.e., aperture stops for modified light source formed with respective cross-shaped light shielding portions (or light reducing portions), an annular opening, i.e., an aperture stop for annular illumination formed with a circular light shielding portion (or a light reducing portion), and an aperture stop (σ stop) formed with a circular or a rectangular opening. The exposure control unit 325 positions a desirable aperture stop for the pattern on the reticle 312 in the vicinity of the exit plane of the third fly eye lens 340 by adjusting the angle of rotation of the stop member 341 via a motor 342.

The light emitted from the stop member 341 passes a lens 343 and is incident on a mirror 344 having the reflectivity of 99.5%. Most of the light is reflected by the mirror 344 to reach a field stop (reticle blind) 349 via a lens 347 and a first relay lens 348. The field stop 349 defines the illumination field of the light EL on the reticle 312 and has a rectangular opening elongated in the X direction. The light EL passing through the field stop 349 illuminates a local area on the reticle 312, i.e., only a rectangular illumination area 352 extending in the X direction with approximately uniform illuminance via a second relay lens 350 and a condenser lens 351. The projection optical system 308 projects a part of the pattern of the reticle 312, i.e., the image of the pattern within the illumination area 352 on the wafer 305.

Further, an imaging characteristics correcting section MC as disclosed in U.S. Pat. No. 5,117,255, is connected to the projection optical system 308. The imaging characteristics correcting section MC changes imaging characteristics of the projection optical system 308 such as the magnification thereof by slightly shifting at least one of a plurality of lens elements constituting the projection optical system 308.

The main control system 322A drives the reticle stage system RST (including the roughly shiftable stage 310 and the minutely shiftable stage 311 in FIG. 13) via the drive unit 322C to shift the reticle 312 at the speed $V_R$ in the Y direction (the rightward direction in the drawing). Also, in synchronism with the movement of the reticle 312, the main control system 322A drives the wafer stage system WST (including the X, Y and Z stages 302 to 304 in FIG. 13) via the drive unit 322B to shift the wafer 305 at the speed $V_W$ in the Y direction (the leftward direction in the drawing). Thereby, the image of the pattern on the reticle 312 is scanned and exposed on the wafer 305. Also, an operator inputs the sensitivity P of the photoresist on the wafer 305 from a keyboard 357 to the main control system 322A. The main control system 322A sends the input sensitivity P to the exposure control unit 325, which then controls the amount of exposure in accordance with the sensitivity P. On the wafer stage system WST is provided a photoelectric detecting device (light amount monitor) 358 for receiving a portion of the light EL, as disclosed in U.S. Pat. No. 4,465,368. A photoelectric signal from the light amount monitor 358 is sent to the main control system 322A. Further, when driving the wafer stage system WST such that the light amount monitor 358 traverses in the Y direction the area where the pattern of the reticle 312 is projected by means of the projection optical system 308, the main control system 312 can measure the width $L_W$ of the projection area in the Y direction by the photoelectric signal input from the light amount monitor 358 and the position information from the interferometer 313 (FIG. 13).

In the scan type exposure apparatus, the shutter 333 is fully opened immediately before the illumination area 352 enters the pattern area of the reticle 312 when the reticle 312 is shifted at the constant speed in the Y direction. Also, the shutter 333 is closed after the illumination area 352 is out of the pattern area of the reticle 312. Namely, the shutter 333 serves only to limit the width of a light shielding zone defining the pattern area on the reticle 312 small but is not used to control the amount of exposure. In this embodiment, the shutter 333 is used in performing a test exposure, checking the control system or the like. For example, when the pattern of the reticle 312 is exposed on the wafer 305 in the state with both the reticle 312 and the wafer 305 stationary, the amount of exposure is controlled by the opening and closing of the shutter 333.

In the meantime, a portion of the light transmitted through the mirror 344 is condensed on the light receiving surface of a photoelectric detecting device (integrator sensor) 346 by a condenser lens 345. Of most of the light reflected by the mirror 344, light reflected by the reticle 312 and light reflected by the wafer 305 return in the same light path, transmit the mirror 344 and reach a photoelectric detecting device (reflectivity monitor) 354 via a condenser lens 353. The output value of the refractivity monitor 354 obtained, provided that the reflected light from the wafer 305 will not return to the reflectivity monitor 354, corresponds to the intensity of the reflected light from the reticle 312. Therefore, when this output value is obtained in advance and when the obtained output value is subtracted from the value output from the refractivity monitor 354 in the state that the wafer 305 is positioned under the projection optical system 308, a value corresponding to the intensity of the reflected light from the wafer 305 is calculated. The output signals from the light amount monitor 358, the integrator sensor 346 and the reflectivity monitor 354 are supplied to the exposure control unit 325 via the main control system 22A and utilized to control the amount of exposure.

The operations of the sensors 346, 354 and 358 will be described in detail now. In the condition that the reticle 312 is not placed on the reticle stage system RST, the shutter 333 is opened to detect the light EL by means of the light amount monitor 355 and the integrator sensor 346. Then, the ratio of the amount of light on the wafer 305 (the output signal from the light amount monitor 358) to the amount of light received by the integrator sensor 346 is measured. Further, after the light amount monitor 358 is moved out of the image field of the projection optical system 308, a reference plate whose reflectivity is preliminarily known is placed in the image field to measure the ratio of the output signal from the integrator 346 to the output signal from the reflectivity monitor 354. By this method, the output signals of reflectivity monitor 354 and the integrator 346 are calibrated with respect to the output signal of the light amount monitor 358.

Next, after the reticle 312 is placed on the reticle stage system RST, the light amount monitor 358 is shifted in the image field of the projection optical system 308 and the scanning of the reticle 312 is started. The main control system 322A samples the output signal from the light amount monitor 358 during the scanning of the reticle 312, and calculates an integrated exposure amount after the end of the scanning. This operation is carried out because the energy reaching the wafer 305 is different for each pattern of reticles, so that it is necessary to correct changes of the magnification β and the focus position of the projection optical system 308 by actually monitoring the integrated exposure amount at the time of the scanning exposure.

When the output signal from the light amount monitor 358 is plotted along the time axis, a constant distribution is ascertained. This indicates the distribution of the pattern of the reticle 312. When that distribution is not uniform, the reticle 312 might be heat-distorted nonlinearly. This is because the distribution of the energy imparted to the reticle 312 has the same characteristic as the distribution of the pattern. Then, in this embodiment, based on the result of the detection (equivalent to the energy distribution), the scanning speed of the reticle stage system RST is minutely regulated during the scanning exposure to correct the heat-distortion of the reticle 312 in the scanning direction thereby to prevent the wafer 305 from being affected by the heat-distortion of the reticle 312. At this time, based on the pattern distribution (energy distribution) obtained from the signal from the light amount monitor 358, the main control system 322A calculates the scanning speed of the reticle stage system RST. Then, the drive unit 322C shifts the reticle 312 at the scanning speed calculated by the main control system 322A. Here, in order to correct the magnification error of the reticle pattern caused by the heat-distortion of the reticle 312 in the scanning direction, the speed ratio of the wafer 305 to the reticle 312 does not coincide with the magnification β of the projection optical system 308. Instead of the reticle stage system RST, the scanning speed of the wafer stage system WST may be regulated minutely. Further, in this embodiment, prior to the scanning exposure, the main control system 322A calculates the magnification error of the reticle 312 based on the above-mentioned energy distribution and the imaging characteristics correcting section MC changes the magnification β such that the calculated magnification error becomes zero. Thereby, the influence of the heat-distortion on the reticle 312 in the nonscanning direction (X direction) can be eliminated. That is, the magnification error of the projected image of the reticle pattern in the nonscanning direction (the X direction) can be corrected.

Also, when exposing the image of the reticle pattern on the wafer 305 while the reticle 312 and the wafer 305 are shifted synchronously, the intensity of the reflected light from the wafer 305 can be measured based on the signal from the reflectivity monitor 354. As this reflected light passes again the projection optical system 308, it is necessary to calculate (estimate) changes of the imaging characteristics (the magnification, the position of a focal point, etc.) of the projection optical system 308 in consideration of the output signal from the reflectivity monitor 354. Then, the main control system 308 estimates changes of the imaging characteristics of the projection optical system 308 from the signal input from the reflectivity monitor 354 and makes the imaging characteristics correcting section MC shift at least one of the lens elements of the projection optical system 308 such that the imaging characteristics are kept within a predetermined value. Therefore, the image of the pattern of the reticle 312 is projected on the wafer 306 while the imaging characteristics of the projection optical system 308 is maintained with high accuracy. As to the position of the focal point, the surface of the wafer 305 may be made to coincide with the optimum imaging surface (best focus position) of the projection optical system 308 by slightly shifting the wafer stage system WST in the Z direction without using the imaging characteristics correcting section MC.

Further, when exchanging the aperture stop by rotating the stop member 341, the intensity of the light EL incident on the reticle 312 (wafer 305) is changed. That is, the level (voltage) of the output signal of the integrator sensor 346 is changed. For example, when the aperture stop with a comparatively small opening is disposed, the level of the output signal of the integrator sensor 346 is lowered. At this time, in order to impart an optimum amount of exposure to the wafer 305 by the scanning exposure in accordance with the sensitivity of the photoresist, between the width $L_W$ of the projection area of the reticle pattern, the sensitivity P of the photoresist, the scanning speed $V_W$ of the wafer 305 and the illuminance Q of the light EL on the wafer 305, the equation (II-5), i.e., $P \times V_W = L_W \times Q$ needs to hold, as mentioned above. Accordingly, when the sensitivity P of the photoresist is input from the keyboard 357, the main control system 322A determines the width $L_W$, the scanning speed $V_W$ and the illuminance Q in accordance with the sensitivity P so as to satisfy the equation (II-5). In this embodiment, as the field stop 349 has the opening whose width is fixed, the illumination area 352 on the reticle 312, i.e., the width of the projection area of the reticle pattern by the projection optical system 308 in the scanning direction (Y direction) is constant. Then, the main control system 322A converts the output signal of the integrator sensor 346 to the illuminance Q on the wafer 305 and determines the scanning speed $V_W$ so as to satisfy the equation (II-5) in accordance with the obtained illuminance Q, the width $L_W$ and the sensitivity P. That is, the scanning speed $V_W$ is lowered in accordance with the decrease of the illuminance Q. On the other hand, when the level of the output signal of the integrator 346 becomes high, the scanning speed $V_W$ needs to be raised in accordance with the increase of the illuminance Q. Namely, when the aperture stop is exchanged by rotating the aperture stop 341 and even though the level of the output signal of the integrator sensor 346 (the illuminance Q on the wafer) is changed, it is sufficient to change the scanning speed $V_W$ so as to satisfy the equation (II-5) after the output signal is converted to the illuminance Q.

Even though the sensitivity P of the photoresist on the wafer is changed, it is possible to impart an optimum amount of exposure to the wafer by determining the width $L_W$, the scanning speed $V_W$ and the illuminance Q so as to satisfy the equation (II-5) in accordance with the sensitivity P. At this time, it is not necessary to change all of the width $L_W$, the scanning speed $V_W$ and the illuminance Q, and it is sufficient to change one of the width $L_W$, the scanning speed $V_W$ and the illuminance Q.

Then, the case in which the sensitivity of the photoresist on the wafer 305 is high will be discussed. When the sensitivity of the photoresist becomes high, the value of the sensitivity P becomes small. In this embodiment, the width of the opening of the field stop 349 is fixed, i.e., the width $L_W$ is constant. Therefore, in order to satisfy the equation (II-5), it is necessary to raise the scanning speed $V_W$ of the wafer 305 or to lower the illuminance Q on the wafer 305 in accordance with the decrease of the value of the sensitivity P. However, when the scanning speed $V_W$ is the maximum value, the scanning speed $V_W$ cannot be raised further, whereby an excessive amount of exposure is imparted to the wafer 305. Therefore, in this embodiment, in order to avoid the excessive exposure of the photoresist, the illuminance Q of the light on the wafer 305 is regulated continuously or in stages so as to satisfy the equation (II-5) by the use of the light reducing filter plate 327 and the power source control unit 324.

Figure 15A:
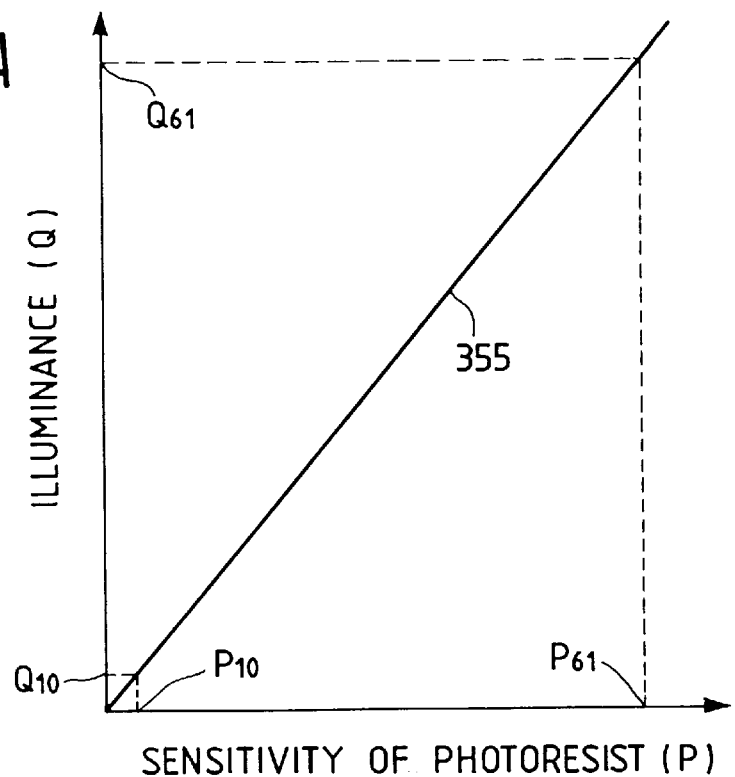
FIG. 15A shows the relationship between the illuminance Q of the light and the sensitivity P of the photoresist.
Figure 15B:
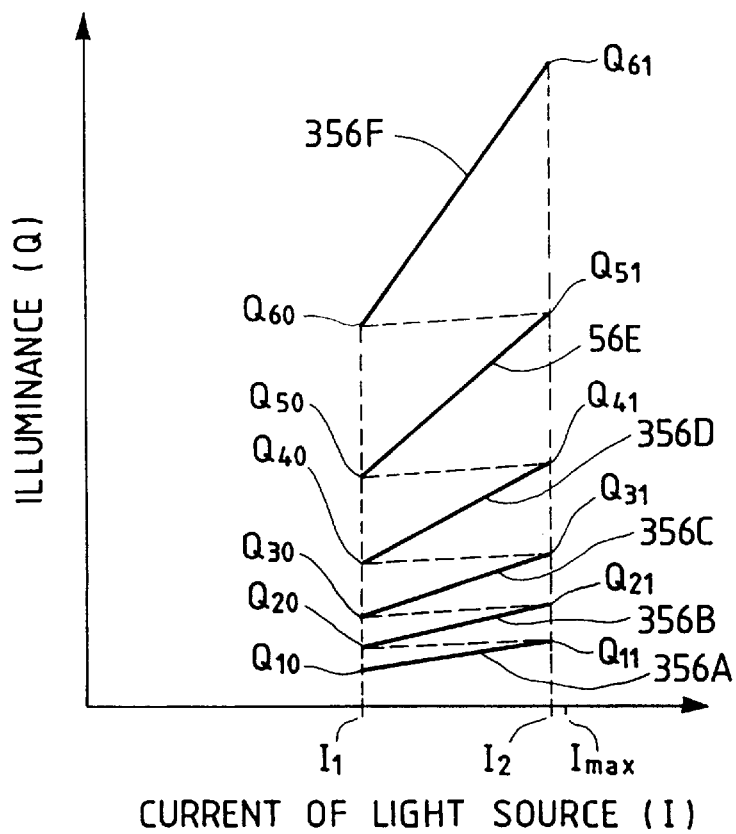
FIG. 15B shows the whole structure of the illuminance Q of the light and the current I of the mercury lamp.

That is, when the width $L_W$ and the scanning speed $V_W$ are constant in the equation (II-5), the illuminance Q of the light and the sensitivity P of the photoresist are in a proportional relation, as indicated by a line 355 in FIG. 15A. A range of the sensitivity P of the photoresist is assumed to be from $P_{10}$ to $P_{61}$. A range of the illuminance Q is assumed to be from $Q_{10}$ to $Q_{61}$ corresponding to $P_{10}$ to $P_{61}$ respectively. Also, when the rated value (the maximum value in the usual use) of the current I supplied to the mercury lamp 323 in FIG. 12 is $I_{max}$, the current I and the illuminance Q are changed approximately linearly in the range wherein the current I is 70% to 100% with respect to the maximum value $I_{max}$. Then, as shown in FIG. 15B, in this embodiment, the current I supplied to the mercury lamp 323 is regulated in the range from the value $I_1$ slightly larger than 70% of the maximum value $I_{max}$ to the value $I_2$ (e.g., 98%) slightly smaller than 100% of the maximum value $I_{max}$. The reason why the maximum value $I_2$ of the current I supplied to the mercury lamp 323 is set to about 98% of the maximum value $I_{max}$ is to leave room for increasing the intensity of the light from the mercury lamp 323 by setting the current I larger than the maximum value $I_2$ without exchanging the light reducing filter during exposure when the intensity of the light from the mercury lamp 323 is lowered due to the passage of time.

In the light reducing filter plate 327 of FIG. 14, the transmittance of the filter 327a is 100% and the transmittances of the filters 327b, 327c, . . . are made gradually smaller in that order. When the filter with the minimum transmittance is disposed in the light path and the current I is $I_1$, the illuminance Q of the light on the wafer 305 becomes $Q_{10}$ in FIG. 15B. Thereafter, when the current I is increased from $I_1$ to $I_2$, the illuminance Q is increased from $Q_{10}$ to $Q_{11}$ as the line 356A. When disposing the filter with the second smallest in the light path and the current I is decreased to $I_1$, the illuminance Q becomes $Q_{20}$. The illuminance $Q_{20}$ is slightly smaller than the illuminance $Q_{11}$.

Similarly, when switching the transmittance of the light reducing filter plate 327 successively, the illuminance Q is increased to $Q_{20}, Q_{30}, \ldots, Q_{60}$. Further, when the current I is increased to $I_2$, the illuminance Q is increased to $Q_{21}, Q_{31}, \ldots, Q_{61}$ along the respective lines 356B, 356C, . . . , 356F. Therefore, according to the present invention, the illuminance Q can be set to any value within $Q_{10}$ to $Q_{61}$ by exchanging the filters of the light reducing filter plate 327 and regulating the current I continuously. The range of the illuminance $Q_{10}$ to $Q_{61}$ corresponds to the range of the sensitivity $P_{10}$ to $P_{61}$.

The illuminance Q of the light on the wafer 305 is constantly monitored by means of the output signal of the integrator sensor 346. During the scanning exposure, the exposure control unit 325 controls the value of the illuminance Q via the power source control unit 324 and the motor 329 so as to satisfy the equation (II-5). Thereby, even though the photoresist is highly sensitive (the value of the sensitivity P is small), it is possible to impart an optimum amount of exposure to the wafer 305 in accordance with the sensitivity P by only regulating the illuminance of the light without changing the scanning speed $V_W$ of the wafer 305. Namely, it is possible to project the pattern of the reticle 312 on the wafer 305 under the highly accurate exposure control. At this time, when the illuminance Q is determined to satisfy the equation (II-5) after the scanning speed $V_W$ of the wafer 305 is set to the maximum value $V_{Wmax}$, the throughput becomes most preferable while an optimum amount of exposure is imparted to the wafer.

On the other hand, when the photoresist has a low sensitivity (the value of the sensitivity P is large), an optimum amount of exposure can be imparted to the wafer 305 by only lowering the scanning speed $V_W$, as is apparent from the equation (II-5). However, the drop of the scanning speed of the wafer 305 leads to lowering of the throughput. Therefore, even though the photoresist with the low sensitivity is used, the scanning speed $V_W$ of the wafer 305 is not lowered and the exposure control unit 325 controls the value of the illuminance Q via the power source control unit 324 and the motor 329 so as to satisfy the equation (II-5). Accordingly, the value of the illuminance Q of the light on the wafer 305 becomes large, so it is possible to impart an optimum amount of exposure to the wafer 305 while not lowering the throughput. In particular, when the value of the illuminance Q is determined to satisfy the equation (II-5) while the scanning speed $V_W$ of the wafer 305 is maintained to the maximum value $V_{Wmax}$, the throughput becomes most preferable while an optimum amount of exposure is imparted to the wafer 305.

In accordance with the change in illuminance Q by the driving of the stop member 341, the illuminance Q may be changed by the use of both the power control unit 324 and the light reducing filter plate 327, instead of changing the scanning speed $V_W$ of the wafer 305. Especially, when the value of the illuminance Q is determined to satisfy the equation (II-5) while maintaining the scanning speed $V_W$ of the wafer 305 to the maximum value $V_{Wmax}$, the throughput becomes most preferable. When the field stop 349 is substituted for a variable stop in addition to the change in illuminance Q by the driving of the stop member 341 and the change in sensitivity P by changing the photoresist, the width $L_W$ of the projection area of the reticle pattern is changed and there occurs a case that the equation (II-5) is not satisfied. In such a case, the width $L_W$ of the projection area of the reticle pattern in the scanning direction (Y direction) is measured by the light amount monitor 358 on the wafer stage system WST and the value of the illuminance Q is determined to satisfy the equation (II-5) in accordance with the measured width $L_W$. Then, even though the width $L_W$ of the projection area of the reticle pattern is changed, an optimum amount of exposure can be imparted to the wafer 305 in accordance with the sensitivity P. In particular, when the scanning speed $V_W$ is set to the maximum value $V_{Wmax}$ and then the illuminance Q is determined, the throughput becomes most preferable. Further, when the scanning speed of the wafer 305 (reticle 312) is changed during the scanning exposure, the equation (II-5) is not satisfied, whereby an optimum amount of exposure cannot be imparted to the whole surface of the wafer 305. Then, during the scanning exposure, the position information (or speed information) from the interferometers 313 and 314 is monitored and in accordance with changes of the scanning speeds of the reticle 312 and the wafer 305, the illuminance Q is changed by the power source control unit 324 and the light reducing filter plate 327 to satisfy the equation (II-5). As a result, even though the scanning speeds of the reticle 312 and the wafer 305 are changed during the scanning exposure, an optimum amount of exposure can be imparted to the wafer 305 in accordance with the sensitivity P. On the other hand, when the illuminance Q is changed during the scanning exposure, the illuminance Q is changed by the power control unit 324 and the light reducing filter plate 327 so as to satisfy the equation (II-5), or the scanning speeds of the wafer 305 the reticle 312 are changed by the respective drive units 322B and 322C. As a result, even though the illuminance Q is changed during the scanning exposure, an optimum amount of exposure can be imparted to the wafer 305 in accordance with the sensitivity P. The width $L_W$ of the projection area of the reticle pattern may be formed variably and the equation (II-5) may be satisfied by changing the width $L_W$ too.

Generally, in scanning type exposure apparatuses for manufacturing semiconductors, the projection optical system is the reduction type. That is, the magnification $\beta$ is less than 1. Therefore, as is apparent from the equation (II-2), the scanning speed $V_R$ of the reticle 312 is faster than the scanning speed $V_W$ of the wafer 305. Then, when the upper limit $V_{Rmax}$ of the scanning speed of the reticle 312 (the maximum speed of the reticle stage system RST) is smaller than $1/\beta$ times the upper limit $V_{Wmax}$ of the scanning speed of the wafer 305 (the maximum speed of the wafer stage system WST), i.e., $V_{Rmax} < V_{Wmax}/\beta$ holds, the scanning speed of the reticle 312 rather than the wafer 305 reaches its upper limit easily. Then, the scanning speed $V_R$ of the reticle 312 always needs to be set to equal to or less than the upper limit $V_{Rmax}$. That is, the above-mentioned expression (II-7) needs to hold always. When the expression (II-7) holds, the scanning speed $V_W$ of the wafer 305 will not exceed the upper limit $V_{Wmax}$. Then, in consideration of the upper limit $V_{Rmax}$ of the scanning speed of the reticle 312, in order to impart an optimum amount of exposure to the wafer 305 in accordance with the sensitivity P, it is necessary to determine the width $L_W$ of the projection area, the illuminance Q and the scanning speed $V_W$ of the wafer 305 so as to satisfy both the equations (II-5) and (II-7).

For example, when the photoresist has high sensitivity, the width $L_W$ of the projection area of the reticle pattern is narrowed and/or the illuminance Q of the light on the wafer 305 is lessened. Accordingly, even in the highly sensitive photoresist, the scanning speed $V_R$ of the reticle 312 never exceeds the upper limit $V_{Rmax}$ and an optimum amount of exposure can be imparted to the wafer 305. However, in this embodiment, only the illuminance Q is varied. Also, when the scanning speed $V_R$ of the reticle 312 is set to the upper limit $V_{Rma}$, i.e., the scanning speed $V_W$ of the wafer 305 is set to $\beta \cdot V_{Rmax}$, the throughput becomes most preferable while an optimum amount of exposure is imparted to the wafer 305.

On the other hand, when the photoresist has a low sensitivity, the value of the left side of the expression (II-7) becomes small. That is, only the scanning speed $V_R$ of the reticle 312 becomes slow, but it is possible to impart an optimum amount of exposure to the wafer 305. However, in that case, the throughput is decreased. Then, while the scanning speed $V_R$ of the reticle 312 is maintained to the upper limit $V_{Rmax}$, at least one of the width $L_W$ and the illuminance Q is determined in accordance to the sensitivity P so as to satisfy both expressions (II-5) and (II-7). At this time, the width $L_W$ of the projection area of the reticle pattern is enlarged and/or the illuminance Q of the light on the wafer 305 is increased. However, in this embodiment, the width $L_W$ is the fixed value and then only the illuminance Q is increased. Therefore, even in the photoresist with the low sensitivity, an optimum amount of exposure can be imparted to the wafer 305 while preventing the throughput from decreasing.

The above description is directed to the case in which $V_{Rmax} < V_{Wmax}/\beta$ holds, but when $V_{Rmax} \geq V_{Wmax}/\beta$ holds, the width $L_W$, the illuminance Q and the scanning speed $V_W$ are determined so as to satisfy both the expressions (II-5) and (II-8). When the expression (II-8) holds, the scanning speed $V_R$ of the reticle 312 never exceeds the upper limit $V_{Rmax}$. Even though all three conditions of the width $L_W$, the illuminance Q and the scanning speed $V_R$ are not formed variably, it is sufficient to determine one or two variable conditions to satisfy both the expressions (II-5) and (II-8) such that the scanning speed $V_W$ of the wafer 305 does not exceed the upper limit $V_{Wmax}$ and the throughput is not lowered.

Although emission lines of the mercury lamp 323 is utilized for illumination in the above first embodiment, it is possible to utilize various other light sources emitting continuous light. Also, the intensity of the light of the mercury lamp 323 is changed by changing the current supplied to the mercury lamp 323 in the first embodiment, but may be changed by changing voltage supplied thereto.

Figure 16:
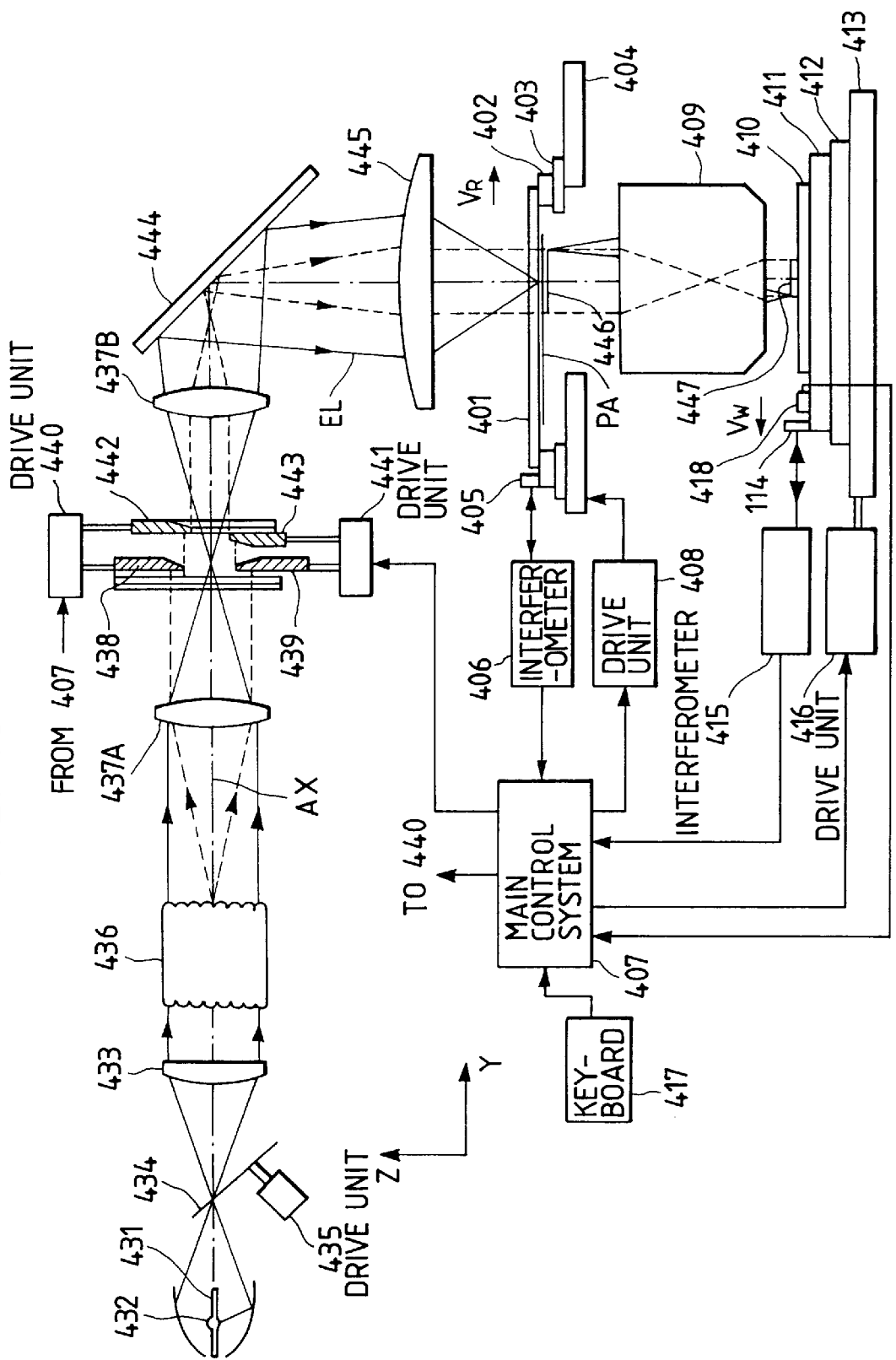
FIG. 16 shows the whole structure of a scanning type projection exposure apparatus according to a fourth embodiment of the present invention.

Next, a fourth embodiment of the present invention will be described with reference to FIGS. 16 to 20. FIG. 16 shows the whole structure of a scanning type exposure apparatus according to this embodiment. In FIG. 16, light EL from an illumination optical system illuminates a local illumination area 446 (e.g., a rectangular area elongated in a direction (X direction) perpendicular to the paper of FIG. 16) on a reticle 401. The light EL transmitted through the reticle 401 enters a projection optical system 409 at least the image side of which is telecentric. The projection optical system 409 projects, of the circuit pattern within a pattern area PA on the reticle 401, the image of the circuit pattern within the illumination area 446 to a wafer 410 with a photoresist applied thereto. When the magnification of the projection optical system 409 is β, the reticle 401 is shifted at the speed $V_R$ in the Y direction parallel to the paper of FIG. 16 in the scanning exposure, and the wafer 410 is shifted in the Y direction at the speed $V_W$ (=β×$V_R$) in synchronism with the movement of the reticle 401. Thereby, the light EL illuminates the whole surface of the pattern area PA on the reticle 401 and the pattern image is scanned and exposed on the wafer 410. In this embodiment, the projection optical system 409 is constituted of only a plurality of refracting elements, so the reticle 401 and the wafer 410 are shifted each other in the opposite directions along the Y direction.

A roughly shiftable stage 403 is disposed on a base 404 and a minutely shiftable stage 402 is disposed on the roughly shiftable stage 403. The reticle 401 is supported on the minutely shiftable stage 402 by the vacuum chuck or the like. The roughly shiftable stage 402 can be shifted in the Y direction. The minutely shiftable stage 402 can be shifted slightly in the X and Y directions and the direction of rotation (θ direction) in a plane perpendicular to the optical axis of the projection optical system 409 to position the reticle 401 with high accuracy. A movable mirror 405 is disposed on the stage 402 and positions of the stage 402 in the X, Y and θ directions are monitored by an interferometer 406. The position information obtained by the interferometer 406 is supplied to a main control system 407.

On the other hand, a Y stage 412 shiftable in the Y direction is disposed on a base 413 and an X stage 411 shiftable in the X direction is disposed on the Y stage. The wafer 410 is supported on the X stage 411 via a vacuum chuck or a θ table (not shown). A movable mirror 414 is fixed to the X stage 411 and positions of the X stage 411 in the X, Y and θ directions are monitored by an interferometer 415. The position information from the interferometer 415 is supplied to the main control system 407 too. The main control system 407 performs alignment of the reticle 401 and the wafer 410 via drive units 408 and 416, controls constant movements of the reticle 401 and the wafer 410 during the scanning exposure. Besides, the main control system 407 controls the whole operation of the apparatus.

Also, e.g., as disclosed in U.S. Pat. No. 4,465,368, on the X stage 411 is provided a photoelectric detecting device (a light amount monitor formed such as of a photomultiplier, a photodiode, etc.) 418 for receiving a portion of the light EL. The light receiving surface of the light amount monitor 418 and the upper surface of the wafer 410 are located approximately at the same height. A photoelectric signal from the light amount monitor 418 is also supplied to the main control system 407, which then can measure the illuminance Q of the light on the wafer 410 and the width $L_W$ of the projection area of the reticle pattern in the scanning direction. A keyboard 417 is connected to the main control system 407 and the operator inputs the sensitivity P of the photoresist on the wafer 410 to the main control system 407 via the keyboard 417. In FIG. 16, the light (e.g., i-lines with the wavelength of 365 nm) emitted from a mercury lamp 431 is condensed by an elliptical mirror 432 and thereafter converted by an input lens 433 to approximately a flux of parallel rays to be incident on a fly eye lens 436. A shutter 434 is disposed in the vicinity of the second focal point of the elliptical mirror 432. The shutter 434 is opened and closed by a drive unit 435 to control the exposure time and the like.

A plurality of secondary light sources (surface illuminant image) are formed in a focal surface on the side of the plane of emission of the fly eye lens 436. The light from the secondary light sources passes a first relay lens 437A and illuminates movable light shielding plates 438 and 439 with uniform illuminance. The light passing an opening of the movable light shielding plates 438 and 439 reaches a variable field stop (reticle blinds) 442 and 443 disposed away from the movable light shielding plates 438 and 439 in the direction of the optical axis AX. The width of an illumination area 446 on the reticle 401 in the scanning direction is determined by an opening formed by the reticle blinds 442 and 443. The movable light shielding plate 438 and the reticle blind 442 are connected to a drive unit 440 while the movable light shielding plate 439 and the reticle blind 443 are connected to a drive unit 441. The light shielding plates 438 and 439 are driven in accordance with movements of the reticle 401 and the wafer 410 during the scanning exposure. That is, the width of the opening of the light shielding plates 438 and 439 is changed. The positions of the reticle blinds 442 and 443 are fixed, so the width of the opening of the reticle blinds 442 and 443 will not be changed during the scanning exposure.

In this embodiment, in accordance with the sensitivity P of the photoresist, the scanning speed $V_R$ of the reticle 401 (the scanning speed $V_W$ of the wafer 410) and the illuminance Q of the light on the wafer 410, the main control system 407 changes the width of the opening of the reticle blinds 442 and 443 by driving them with the respective drive units 440 and 441 and sets the width $L_R$ of the illumination area 446 on the reticle 401 in the scanning direction (Y direction), i.e., the width $L_W$ of the projection area of the reticle pattern on the wafer 410 in the Y direction so as to satisfy the equation (II-5). Further, the main control system 407 controls positions of the movable light shielding plates 438 and 439 by means of the drive units 440 and 441 during the scanning exposure.

Figure 17:
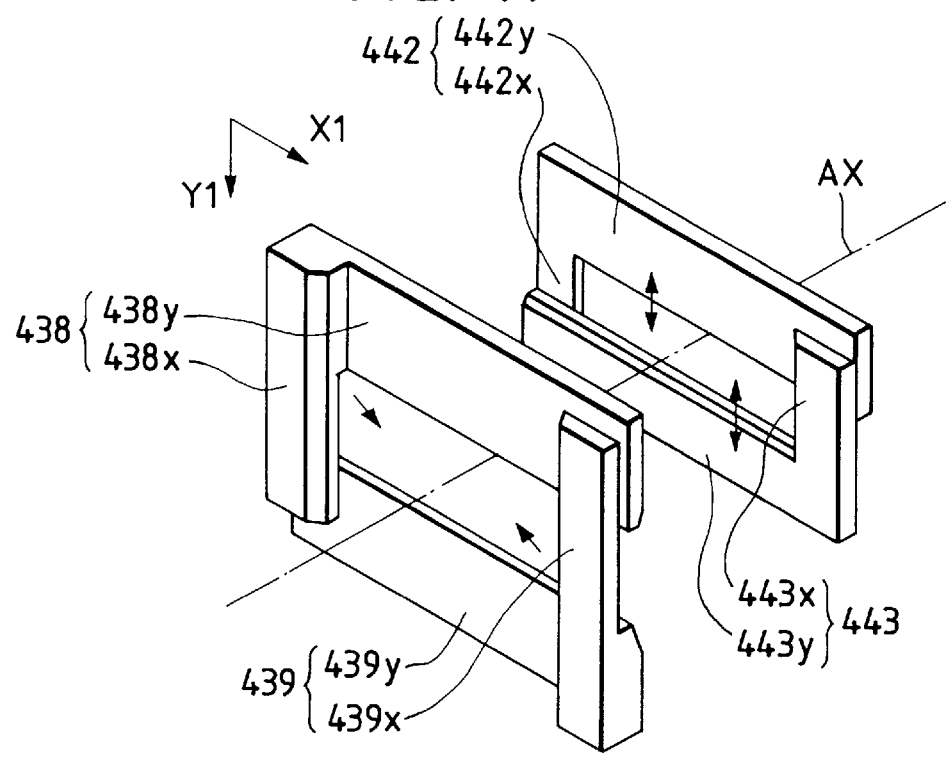
FIG. 17 shows the structure of movable light shielding plates and reticle blinds of FIG. 16.

FIG. 16 shows the arrangement of the movable light shielding plates 438 and 439 and the reticle blinds 442 and 443 along the optical axis AX of the illumination optical system. In FIG. 17, the direction corresponding to the scanning direction (Y direction) of the reticle 401 is Y1 and the direction corresponding to the nonscanning direction (X direction) is X1.

The movable light shielding plate 438 is formed integrally of a blade 438y extending perpendicularly to the Y1 direction and a blade 438x whose edge extends perpendicularly to the X1 direction. The movable light shielding plate 439 is formed integrally of a blade whose edge 439y extends perpendicularly to the Y1 direction and a blade 439x whose edge extends perpendicularly to the X1 direction. The blades 438y, 439y and the blades 438x, 439x are displaced in the direction of the axis AX so as not to interfere with each other. The movable light shielding plates 438 and 439 are supported so as to be shiftable in the X1 and Y1 directions. The illumination area 446 of the reticle 401 is limited in the Y direction by the blades 438y and 439y and limited in the X direction by the blades 438x and 439x.

The reticle blind 442 is an L-shaped light shielding member (blade) integrally formed of a knife edge 442y extends perpendicularly to the Y1 direction and a knife edge 442x extending perpendicularly to the X1 direction. On the other hand, the reticle blind 443 is an L-shaped light shielding member (blade) integrally formed of a knife edge 443y extending perpendicularly to the Y1 direction and a knife edge 443x extending perpendicularly to the X1 direction. The reticle blinds 442 and 443 are displaced from each other in the direction of the optical axis AX and can be shiftable in the X1 and Y1 directions.

Referring to FIG. 16 again, the light passing the rectangular opening surrounded by the movable light shielding plates 438 and 439 reaches the reticle blinds 442 and 443. Further, the light passing the rectangular opening surrounded by the reticle blinds illuminates the reticle 401. Namely, the light EL passing the opening of the reticle blinds 442 and 443 illuminates the illumination area 446 on the reticle 401 with uniform illuminance via a second relay lens 437B, a mirror 444 and a condenser lens 445. More specifically, the illumination area 446 is defined by the opening of the reticle blinds 442 and 443 and the light EL illuminates an area where the illumination area 446 is overlapped with an illumination field defined by the opening of the movable light shielding plates 438 and 439. The pattern of the reticle 401 is projected to an area 447 conjugate to the illumination area 446 with respect to the projection optical system 409.

Of the movable light shielding plates 438 and 439, the blades 438y and 439y (FIG. 17) for setting an illumination field on the reticle 401 in the scanning direction (Y direction) are disposed in a plane conjugate to the pattern surface of the reticle 401 and the blades 438x and 439x for setting an illumination field in the nonscanning direction (X direction) are displaced slightly from the conjugate plane toward the first relay lens 437A (or placed in a defocus position). The reticle blinds 442 and 443 are displaced (defocus) from the plane conjugate to the pattern surface of the reticle 401 toward the second relay lens 437B at a predetermined distance.

Figure 18:
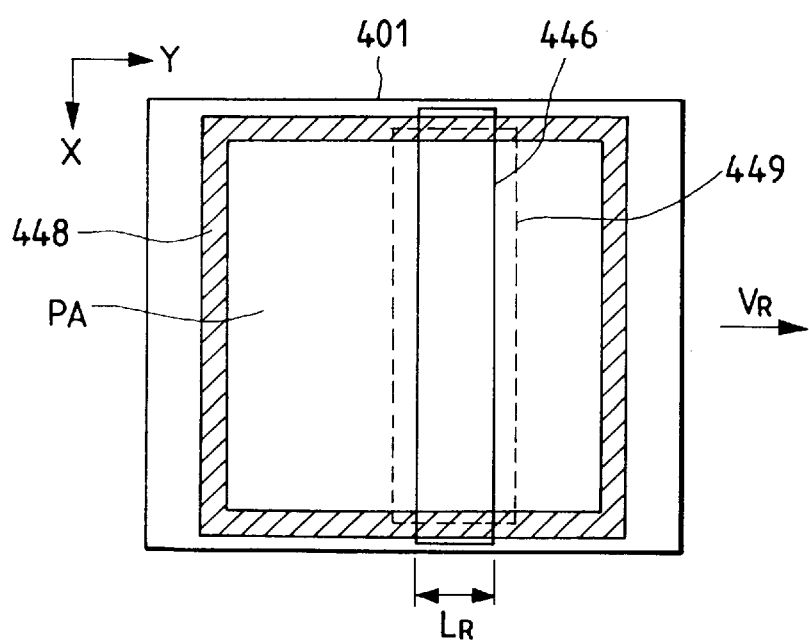
FIG. 18 shows the illumination area on the reticle of FIG. 16.

Next, the operation of the scanning exposure of this embodiment will be described. FIG. 18 shows the structure of the reticle 401. The image of the pattern within the pattern area PA on the reticle 401 is transferred on the wafer 410 in the scanning exposure. The pattern area PA is surrounded by a light shielding zone 448 having a predetermined width. As mentioned above, the light EL illuminates the area on the reticle 401 where the illumination area 446 defined by the reticle blinds 442 and 443 is overlapped with the illumination area 449 defined by the movable light shielding plates 438 and 439. When two edges of the illumination area 446 extending in the nonscanning direction (X direction) are located within the pattern area PA, two edges of the illumination area 449 extending in the X direction are located outside the illumination area 446. Further, two edges of the illumination area 449 in the Y direction are located within the light shielding zone 448 and two edges of the illumination area 446 extending in the Y direction are located outside the light shielding zone 448.

When one of the two edges of the illumination area 446 extending in the X direction comes outside the light shielding zone 448 at the time of the start or end of the scanning exposure, the movable light shielding plate 438 or 439 is shifted to make one of the two edges of the illumination area 449 extending in the X direction remain within the light shielding zone 448. Thereby, there is no light reaching the wafer 410 while passing outside the light shielding zone 448, so that the wafer 410 will not be exposed unnecessary.

Figure 19:
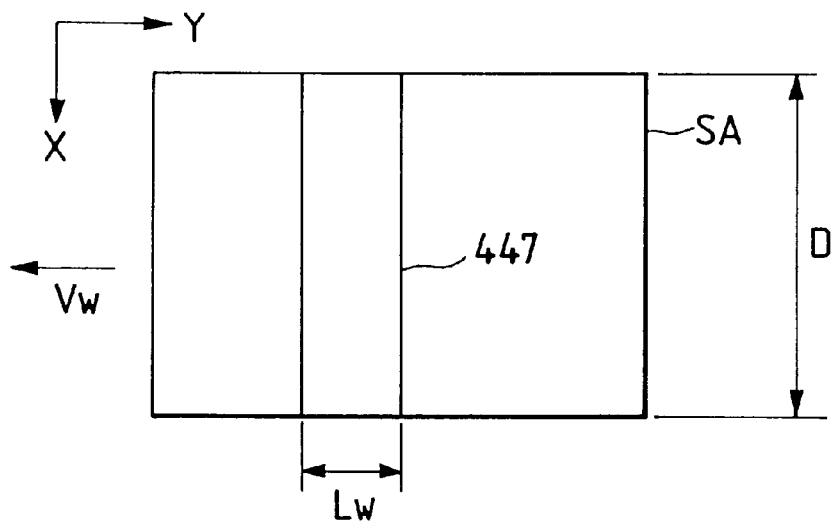
FIG. 19 shows the projection area of the reticle pattern on the wafer of FIG. 16.

FIG. 19 shows a shot area SA of the wafer 410 on which the circuit pattern within the pattern area PA is transferred. The image of the pattern within the illumination area 446 of FIG. 18 is projected to the rectangular area 447 on the shot area SA. The width of the rectangular area (the projection area of the reticle pattern by the projection optical system) 447 in the Y direction is $L_W$, and the width thereof in the X direction is D. The wafer 410 is shifted at the scanning speed $V_W$ in the −Y direction (the leftward direction in the drawing) with respect to the rectangular area 447. In this embodiment, the reticle blinds 442 and 443 are driven in accordance with the sensitivity P of the photoresist on the wafer 410. Namely, the width $L_R$ of the illumination area 446 on the reticle 401, i.e., the width $L_W$ of the projection area 447 of the reticle pattern is set so as to satisfy the equation (II-5).

For example, the case in which the magnification β of the projection optical system 409 is ⅕, the width $L_W$ of the rectangular area 447 on the wafer 410 is 10 [mm], the illuminance Q of the light on the wafer 410 is 800 [mW/cm$^2$], the maximum value $V_{Rmax}$ of the scanning speed $V_R$ of the reticle 401 is 250 [mm/sec], the sensitivity P of the photoresist is 200 [mJ/cm$^2$] is considered. At this time, the optimum exposure time t at a point on the wafer 410 is from the equation (II-3) as follows:

$$t=P/Q=200/800=0.25[\text{sec}].$$

The scanning speed $V_R$ of the reticle 401 is from the equation (II-6) as follows:

$$V_R=L_W\times Q/(\beta\times P)=5\times 10/0.25=200[\text{mm/sec}].$$

Further, from the equation (II-6), the range of the sensitivity P of the photoresist when $V_R>V_{Rmax}$ is as follows:

$$P<L_W\times Q/(\beta\times V_{Rmax})=5\times 10\times 800/250=160[\text{mJ/cm}^2].$$

Then, in a highly sensitive photoresist with the sensitivity P of 160 [mJ/cm$^2$] or less, the scanning speed $V_R$ of the reticle exceeds the maximum speed $V_{Rmax}$. Therefore, for example, when using a photoresist with the sensitivity P of 100 [mJ/cm$^2$] and when setting the scanning speed $V_R$ of the reticle to the upper limit 250 [mm/sec], the width $L_W$ of the projection area 447 is determined from the equation (II-6) as follows:

$$L_W=V_R\times\beta\times P/Q=(250\times\tfrac{1}{5}\times 100)/800=6.25[\text{mm}].$$

Although the scanning speed $V_R$ of the reticle is set to the maximum speed $V_{Rmax}$, it is because when the scanning speed $V_R$ is made as large as possible, the exposure time is shortened and it is advantageous in terms of the throughput. Therefore, while the scanning speed $V_R$ is fixed to $V_{Rmax}$, only the width $L_W$ may be varied in accordance with the change of the sensitivity P of the photoresist. If the limitation of the throughput is comparatively loose, the scanning speed $V_R$ of the reticle may be lowered from the maximum speed $V_{Rmax}$. Also, as mentioned in the first embodiment, the illuminance Q may be made variable and both the width $L_W$ and the illuminance Q may be changed so as to satisfy the equation (II-5) and so as to correspond to the sensitivity P of the photoresist.

After the width $L_W$ of the projection area 447 is determined as above, the main control system 407 changes the width of the opening of the reticle blinds 442 and 443 by driving the reticle blinds 442 and 443 by means of the drive units 440 and 441. Thereby, it is possible to impart an optimum amount of exposure to the whole shot areas on the wafer 410 in accordance with the sensitivity P of the photoresist in the scanning exposure. At this time, prior to the start of the scanning exposure, the main control system 407 may measure the width $L_W$ of the projection area 447 by the use of the light amount monitor 418 to check the setting accuracy of the reticle blinds 442 and 443. In that case, when the setting accuracy of the reticle blinds 442 and 443 is not preferable, the width of the opening thereof is reset by driving the reticle blinds 442 and 443 by means of the drive units 440 and 441, thereby making it possible to set the width $L_W$ of the projection area 447 to the previously calculated value with accuracy. Also, instead of changing the width $L_W$ by driving the reticle blinds 442 and 443, the scanning speed $V_R$ of the reticle and/or the illuminance Q may be changed so as to satisfy the equation (II-6). The main control system 407 drives the Y stage 412 to make the light amount monitor 418 traverse the projection area 447 of the reticle pattern defined by the projection optical system 409 in the Y direction and obtains the width $L_W$ of the projection area 447 in the Y direction in accordance with the photoelectric signal from the light amount monitor 418 and the position information from the interferometer 415.

In the meantime, in accordance with the change of the mercury lamp 431 due to the passage of time, there is a danger that the illuminance Q on the wafer 410 is gradually reduced. Then, prior to the scanning exposure, the light amount monitor 418 is shifted in the image field of the projection optical system 409, i.e., the projection area 447 by driving the X and Y stages 411 and 412 and the illuminance Q is obtained based on the photoelectric signal from the light amount monitor 418. Then, based on the obtained illuminance Q, the width $L_W$ of the projection area 447 is calculated from the equation (II-6) and the reticle blinds 442 and 443 are shifted in accordance with the calculated width $L_W$. Accordingly, even though the illuminance Q is changed because of the change of the mercury lamp 431, exposure control accuracy will not be deteriorated, so that an optimum amount of exposure can be imparted to the wafer 410 in accordance with the sensitivity P of the photoresist.

Figure 20:
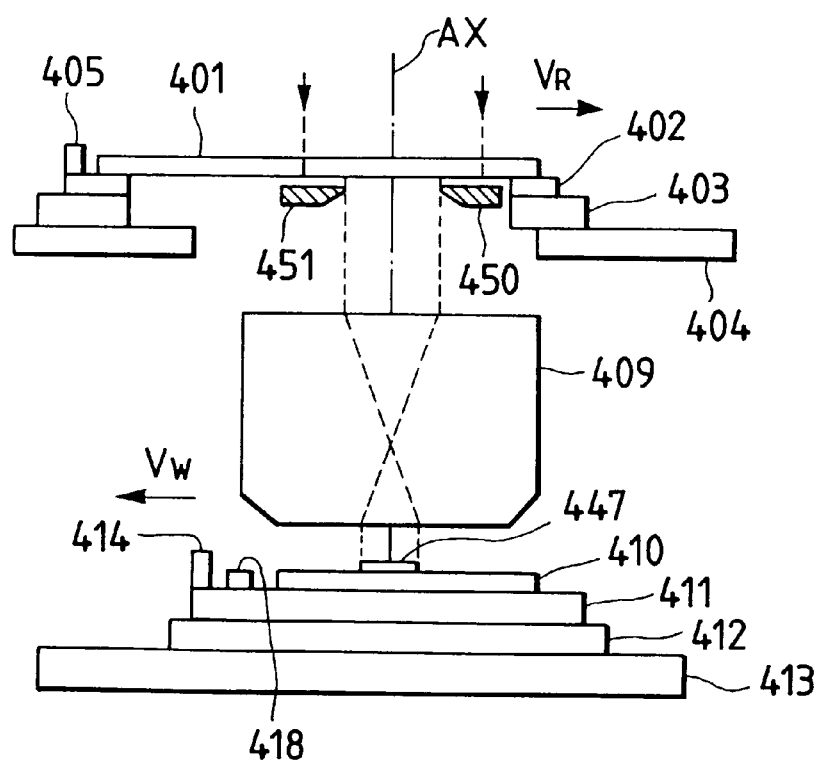
FIG. 20 shows another example of the reticle blinds of FIG. 16.

In this embodiment, the width $L_W$ of the projection area 447 of the reticle pattern on the wafer 410 in the scanning direction is set by the reticle blinds 442 and 443 disposed in the vicinity of the plane conjugate to the pattern surface of the reticle 401 in the illumination optical system. However, as shown in FIG. 20, the width $L_W$ of the projection area 447 on the wafer 410 may be set by reticle blinds 450 and 451 disposed close to the pattern surface of the reticle 401. In FIG. 20, elements identical to those in FIG. 16 are designated by the same reference numerals. The reticle blinds 450 and 451 are L-shaped movable blades (only shown in cross section in FIG. 20).

As described above, although only the illuminance Q is changed in accordance with the change of the illuminance Q due to the drive of the stop member 341 in the third embodiment, the width $L_W$ of the projection area is changed in this embodiment. Also, when the scanning speeds of the reticle and the wafer are changed, the width $L_W$ are changed by driving the reticle blinds 442 and 443 in accordance with the position information (or speed information) from the interferometers 406 and 415. Thereby, even though the scanning speeds are changed during the scanning exposure, an optimum amount of exposure can be imparted to the wafer in accordance with the sensitivity P. Further, even though the illuminance Q is changed during the scanning exposure, the width $L_W$ should be changed by driving the reticle blinds 442 and 443 so as to satisfy the equation (II-6). In this case, it is preferable to provide the integrator sensor 346 (FIG. 12) and to drive the reticle blinds 442 and 443 in accordance with the output signal thereof.

Figure 21:
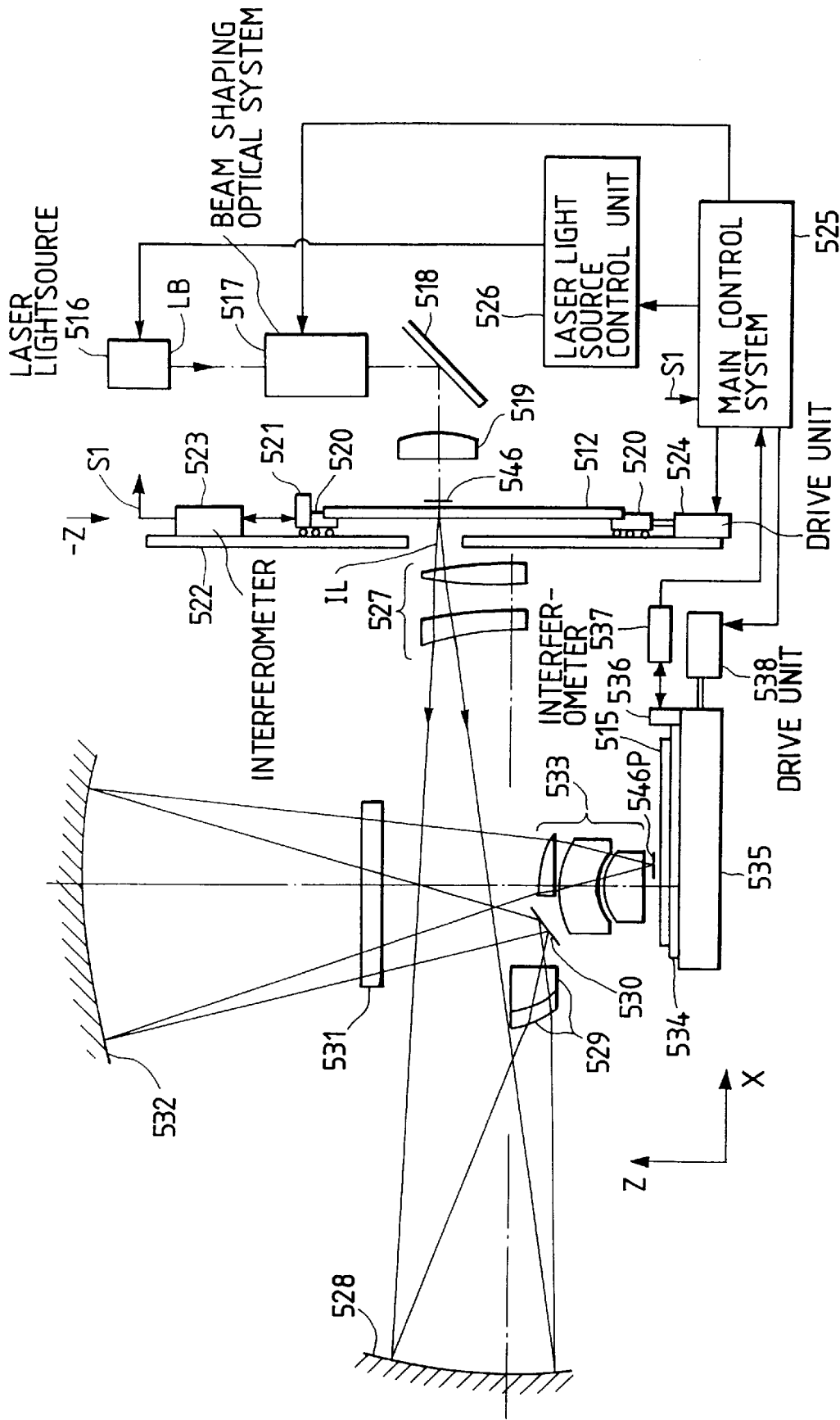
FIG. 21 shows the whole structure of a scanning type projection exposure apparatus according to a fifth embodiment of the present invention.

Next, a fifth embodiment of the present invention will be described with reference to FIGS. 21 to 23. In this embodiment, the present invention is applied to a scanning type projection exposure apparatus equipped with a pulse oscillation type laser light source and a reflecting and refracting projection optical system. FIG. 21 shows the whole structure of the scanning type projection exposure apparatus of this embodiment.

In FIG. 21, a laser beam LB emitted from a pulsed laser light source 516 such as an excimer laser light source, etc.

is incident on a beam shaping optical system 517 having a beam expander, an optical integrator, an aperture stop, a relay lens system, a variable field stop, and the like. The laser beam IL emitted from the beam shaping optical system 517 illuminates a reticle 512 with uniform illuminance via a mirror 518 and a condenser lens 519.

The reticle 512 is supported on a reticle stage 520, which is shiftable at a constant speed along a guide 522 in a Z direction (a vertical direction in FIG. 21). A reticle stage 520 is provided with a movable mirror 521 for reflecting a laser beam from an interferometer 523 fixed to the guide 522. A drive unit 524 is connected to the reticle stage 520 to shift the reticle stage 520 in the Z direction and to slightly rotate the reticle stage 520 for correction of yawing, etc. The position of the reticle 512 in the Z direction and the amount of yawing thereof are constantly measured by the interferometer 523. These measured data S1 are supplied to a main control system 525. The main control system 525 shifts the reticle stage 520 via the drive unit 524 and controls the operation of the pulsed laser light source 516 via a laser light source control unit 526. Besides, the main control 525 controls the whole operation of the apparatus.

The pulsed laser light IL passed through the pattern of the reticle is led via a first lens group 527 to a first concave mirror 528. Due to the reflection by the first concave mirror 528, a predetermined reduced magnification can be obtained. The pulsed laser light reflected by the first concave mirror 528 passes a second lens group 529 and is reflected by a plane reflecting mirror 530 to be incident on a second concave mirror 532 via a negative lens 531. Due to the reflection by the second concave mirror 532, a magnification slightly larger than the life-size is imparted to the pulsed laser light. The pulsed laser light reflected by the second concave mirror 532 again passes the negative lens 531 and is given a reduced magnification by a third lens group 533 to be incident on a wafer 515. The pattern on the reticle 512 within an illumination area 546 is projected on the wafer 515 at the magnification of ×¼. In this embodiment, the projection optical system is constituted of the elements from the first lens group 527 to the third lens group 533.

The wafer 515 is supported on a slightly rotatable wafer holder 534. The wafer holder 534 is fixed on a wafer stage 535. The wafer stage 535 has an XY stage for positioning the wafer 515 in the horizontal and vertical directions (X and Y directions) in the paper of FIG. 21, a Z stage for positioning the wafer 515 in the Z direction, and the like. A movable mirror 536 is fixed on the wafer stage 535 to reflect a laser beam from an interferometer 537. The interferometer 537 constantly measures the position and the amount of yawing of the wafer 515 in the XY plane. These measured data are supplied to the main control system 525. The main control system 525 controls the operation of the wafer stage 535 via a drive unit 538.

Figure 22:
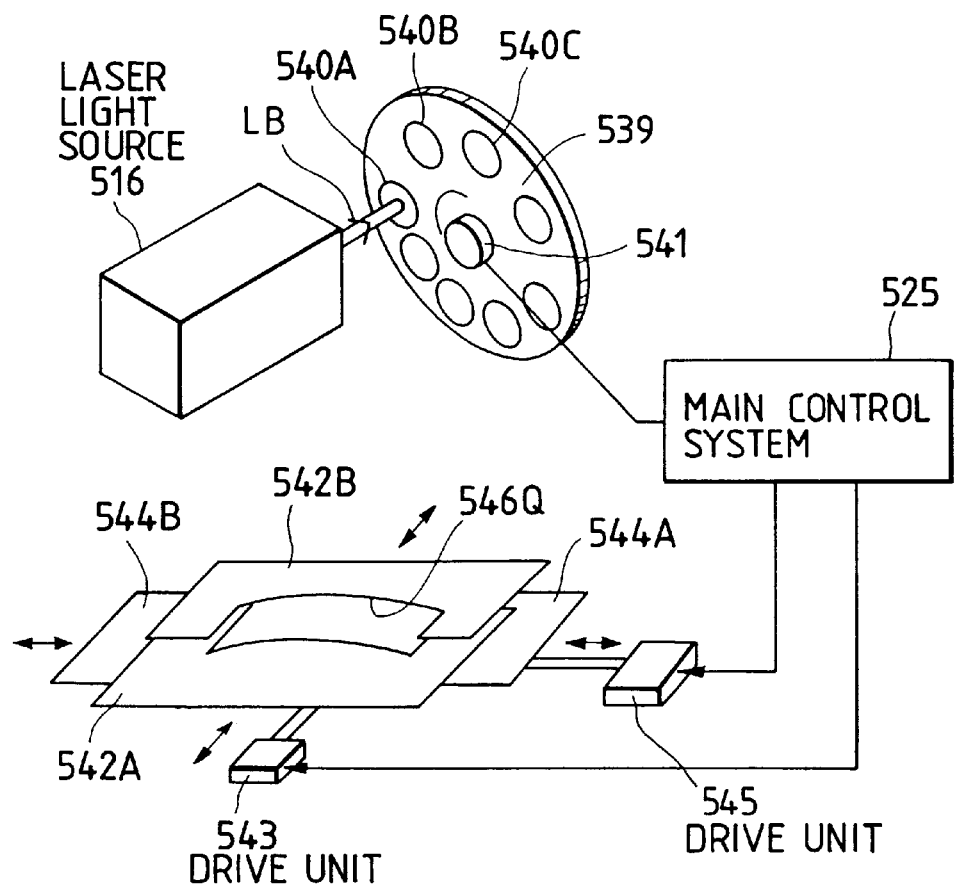
FIG. 22 shows the beam shaping optical system of FIG. 21.
Figure 23:
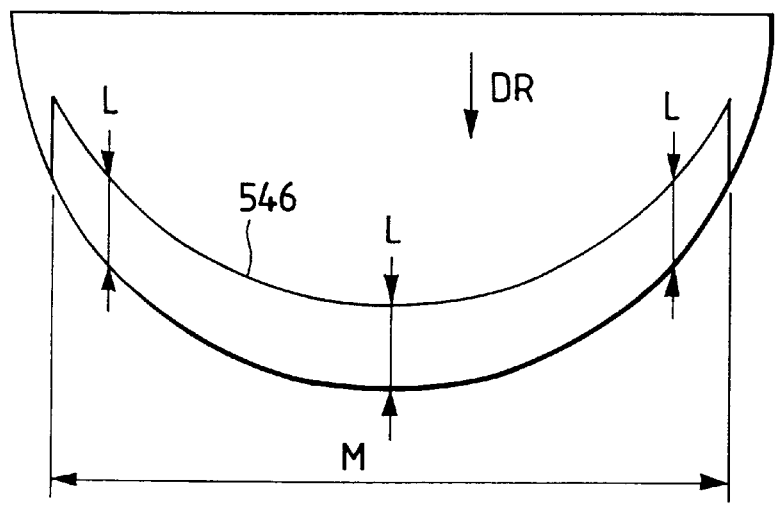
FIG. 23 shows the circular arc-shaped illumination area on the reticle of FIG. 21.

FIG. 22 schematically shows the structure of a portion of the beam shaping optical system 517 of FIG. 23. A rotating plate 539 is disposed in the light receiving section of the beam shaping optical system 517. The peripheral portion of the rotating disk is provided with ND filter 540A, 540B, 540C, . . . , having different transmittances with respect to the laser beam LB. The main control system 525 can set the illuminance of the pulsed laser light IL illuminating the wafer 515 within a desired range by adjusting the angle of rotation of the rotating plate 539 via a drive unit 541. A light amount monitor (not shown) is disposed on the wafer stage 535 for monitoring the illuminance of the pulsed laser light IL.

In FIG. 22, two long blades 542A, 542B and two short blades 544A, 544B constitute a variable field stop. The illumination area 546 on the reticle 512 is defined by a circular arc-shaped opening 546Q surrounded by the four blades 542A, 542B, 544A, 544B. The main control system 525 can adjust the size of the opening 546Q by adjusting the distance between the blades 542A and 542B via a drive unit 543 and the distance between the blades 544A and 544B. The projected image of the opening 546Q on the pattern surface of the reticle 512 is the circular arc-shaped illumination area 546.

FIG. 23 shows the illumination area 546 on the reticle 512. The illumination area 546 is a circular arc-shaped area surrounded by two parallel circular arcs having the distance L and two parallel straight lines having the distance M. That is, the width of the illumination area 546 in the longitudinal direction is M and the width of the illumination area 546 in the direction (DR direction) perpendicular to the longitudinal direction is L anywhere. While scanning the reticle 512 in the DR direction, laser beams illuminate, via the illumination area 546, the pattern area on the reticle 512 successively. The DR direction in FIG. 23 is the −Z direction in FIG. 21.

In this embodiment, during the scanning exposure, the reticle 512 is scanned in the −Z direction (DR direction in FIG. 23) at a constant speed V by means of the drive unit 524 and the reticle stage 520 while laser beams IL are directed to the illumination area 546. The image of the pattern of the reticle 512 within the illumination area 546 is projected to an exposure area 546P on the wafer 515 conjugate to the illumination area 546. When the magnification of the projection optical system (527 to 533) is $\beta$ ($\beta=\frac{1}{4}$ in this embodiment), the wafer 515 is scanned by the drive unit 538 and the wafer stage 535 in the X direction at a constant speed $\beta \cdot V$.

In scanning the reticle 512 and the wafer 515, for example, the difference between the measured value of the interferometer 523 and the measured value of the interferometer 537, when an alignment mark on the reticle 512 coincides with an alignment mark on the wafer 515, is stored as the reference value. And, the operation of the drive units 524 and 538 are controlled such that the difference between the measured value of the interferometer 523 and the measured value of the interferometer 537 becomes the reference value. Therefore, the reticle 512 and the wafer 515 are scanned constantly in a predetermined relation with respect to the illumination area 546 and the exposure area 546P respectively.

Next, the condition of the width of the circular arc-shaped exposure area 546P in the scanning direction will be described.

Figure 24A:
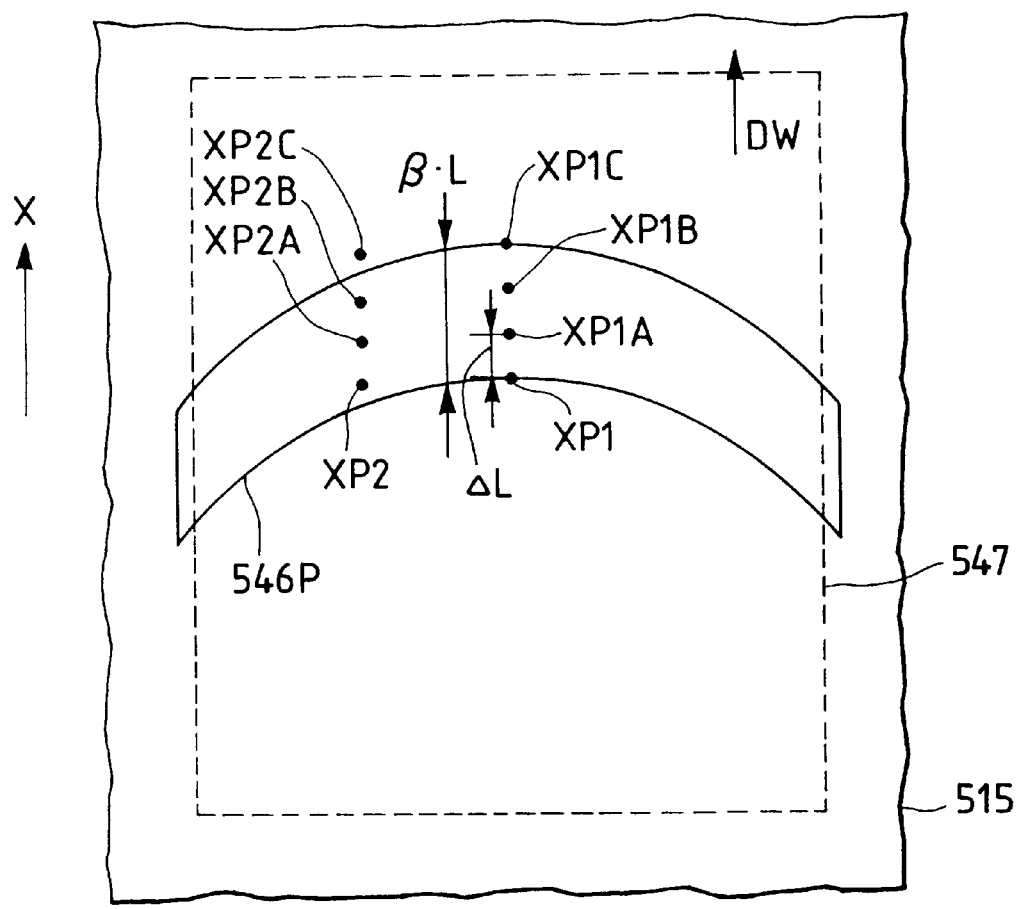
FIG. 24A shows the circular arc-shaped projection area of the reticle pattern on the wafer.

FIG. 24A shows the exposure area 546P on the wafer 515 in this embodiment. In FIG. 24A, when the direction in which the wafer 515 is scanned with respect to the exposure area 546P is a DW direction (corresponding to the X direction in FIG. 21), the width of the exposure area 546P in the DW direction is $\beta \cdot L$. The period (the reciprocal of the frequency of light emission) of the light emission of the pulsed laser light source 516 is T. The distance by which the wafer 515 is scanned in the DW direction per period T during the scanning exposure is $\Delta L$. In this case, the width $\beta \cdot L$ of the exposure area 546P in the DW direction is set to an integral multiple of the distance $\Delta L$. Also, as the scanning speed of the wafer 515 in the DW direction is $\beta \cdot V$, the distance $\Delta L$ is $T \cdot \beta \cdot V$. That is, letting n be an integer of 1 or more, the following equation holds:

$\beta \cdot L = n \cdot \Delta L = n \cdot T \cdot \beta \cdot V$.

In FIG. 24A, the case in which n=3, i.e., $\beta \cdot L = 3 \cdot \Delta L$ is shown. In this case, for example, a point XP1 on the wafer 515 located on an edge of the exposure area 546P in the emission of a laser beam is scanned successively at positions XP1A, XP1B and XP1C in that order in the following emissions of laser beams in that order. If the exposure energy imparted to each exposure point within the exposure area 546P in the emission of a laser beam is $\Delta E$, the exposure energy of $3 \cdot \Delta E$ ($=\Delta E/2 + 2 \cdot \Delta E + \Delta E/2$) is imparted to the exposure point XP1. Also, for example, an exposure point XP2 on the wafer 515 located inside the edge of the exposure area 546P in the emission of a laser beam is scanned successively at positions XP2A, XP2B and XP2C in that order in the following emissions of laser beams. The exposure energy of $3 \cdot \Delta E$ is imparted to the exposure point XP2. Therefore, in this embodiment, all the exposure points on the wafer 515 scanned by the exposure area 546P receives the same exposure energy of $n \cdot \Delta E$. As a result, unevenness of illuminance does not occur and imaging characteristics on the wafer is improved. However, as the exposure energy is varied for each emission of laser beams, the influence of such variations will be described later.

Figure 24B:
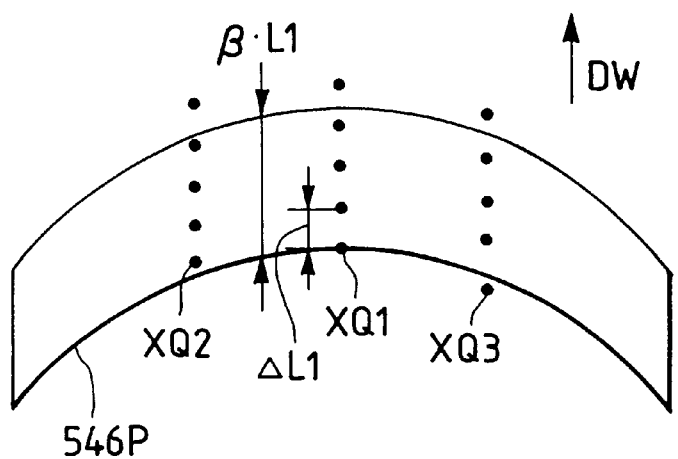
FIG. 24B shows a circular arc-shaped projection area of the reticle pattern when not applying the fifth embodiment.

On the other hand, in FIG. 24B, the width of the exposure area 546P in the DW direction is $\beta \cdot L_1$. The width $\beta \cdot L_1$ is 3.5 times the distance $\Delta L_1$ by which the wafer 515 is scanned in the DW direction for the period T during the scanning exposure. In this case, the exposure energy of $3.5 \cdot \Delta E$ is imparted to an exposure point XQ1 on the wafer 515 located on the edge of the exposure area 546P. The exposure energy of $4 \cdot \Delta E$ is imparted to an exposure point XQ2 on the wafer 515 located inside the edge of the exposure area 546P. The exposure energy of $3 \cdot \Delta E$ is imparted to an exposure point XQ3 on the wafer located outside the edge of the exposure area 546P. Therefore, unevenness of illuminance (unevenness of the amount of light) occurs.

Next, the operation of the scanning exposure of this embodiment will be described. First, in FIG. 21, the scanning speed $\beta \cdot V$ of the wafer 515 in the X direction is determined in accordance with the average illuminance E of the pulsed laser light IL on the wafer 515 per pulse, the sensitivity of the photoresist and the variation $\Delta Ei$ (i=1, 2, . . . ) of the illuminance of the pulsed laser light IL for each emission. As mentioned above, in this embodiment, as the pulsed laser light IL illuminate each exposure point on the wafer 515 n times, the integrated exposure amount ET becomes as follows. $\Sigma$ means the sum from 1 to n with respect to the letter i.

ET=$\Sigma$(E+$\Delta$Ei).

Thereby, it is known that as the number n of times in which the pulsed laser light IL is emitted is increased, the variation of the integrated exposure amount, i.e., the unevenness of the exposure amount is reduced. Accordingly, depending on the matter that the variation of the integrated exposure amount ET is limited to what extent, the value n (the number of pulses) is determined. For example, n is set to 20, the unevenness of the light amount is limited to about 0.05%. Also, as the integrated exposure amount ET for each exposure point on the wafer 515 is $n \cdot E$, it is determined to what extent the intensity of the laser beam LB should be set in accordance with the sensitivity of the photoresist P. In order to set the intensity of the laser beam LB to the determined value, the main control system 525 rotates the rotating plate 539 (FIG. 22) to position the ND filter with the desired transmittance.

Next, as shown in FIG. 23, in response to the width L of the illumination area 546 on the reticle 512 in the DW direction, the scanning speeds of the reticle 512 and the wafer 515 are set. First, in FIG. 24A, the width of the exposure area 546P on the wafer 515 in the DW direction is β·L. The scanning speed of the wafer 515 in the DW direction is β·V. The distance by which the wafer 515 is shifted in the DW direction for the period T of the light emission of the pulsed laser light source 516 is T·β·V. Then, the following equation holds:

$$\beta \cdot L = n \cdot \Delta L = n \cdot T \cdot \beta \cdot V.$$

Thereby, the scanning speed V of the reticle 512 becomes as follows. This scanning speed V is used to set the scanning speed of the wafer 515 to β·V.

$$V = L/(n \cdot T).$$

Also, as there is the upper limit $V_{max}$ to the scanning speed V of the reticle 512, the value of the width L of the illumination area 546 on the reticle 512 in the scanning direction is adjusted so as to be $V \leq V_{max}$. For that purpose, the distance between the blades 542A and 542B in FIG. 22 is adjusted. Thereafter, when the image of the pattern of the reticle 512 is exposed on the wafer 515 in the scanning exposure, in the entire exposure area on the wafer 515, the illuminance of the pulsed laser light IL becomes approximately the same level and preferable transferring characteristics can be obtained.

Although intervals (period T) of light emissions are made constant in the above description, the period T may be regulated while the scanning speed V is set to $V_{max}$ and the width L is set to a value corresponding to $V_{max}$. This is performed by the control unit 526 upon receiving instructions from the main control system 525. Also, if the distance (L) between the blades 542A and 542B is fixed, the period T of the light emission and/or the scanning speed V of the reticle 512 may be adjusted from V=L/(n·T) based on the predetermined value n. Namely, at least one of the distance L, the period T and the scanning speed V is adjusted such that n (integer) laser beams are emitted while the exposure area 546P and the wafer 515 are shifted relatively by the width (β·L) of the exposure area 546P in the scanning direction. At this time, it is desirable that the value n equals to a minimum number of pulses (determined in accordance with the variations of the amount of energy of laser beams) necessary for achieving desired uniformity of illuminance on the wafer. This method of determining the required number of pulses is disclosed in, e.g., U.S. Pat. No. 5,097,291. Also, when the power of the laser beam is changed by changing the period T of the light emission, the power of the laser beam needs to be readjusted by adjusting the angle of the rotating plate 539.

In this embodiment, between the scanning speed V of the reticle 512, the period T of the light emission and the width L of the illumination area 546 on the reticle 512, it is sufficient that the relation V=L/(n·T) is satisfied by the use with the integer n of 1 or more. Accordingly, in a range satisfying this relation, it is possible to set the scanning speed V close to an optimum speed not causing vibrations, to set the period T close to a period capable of preventing unevenness of illuminance maximumly and stabilizing the output, and to set the width L of the illumination area close to an optimum width in consideration of uniformity of distortion, leveling of the wafer 515 and the like. Thereby, while keeping unevenness of illuminance on the wafer 515 minimum, the performance of the exposure apparatus can be enhanced maximumly.

That is, in this embodiment, after setting the value n to the number of pulses for achieving uniformity of illuminance, and when attaching importance to the throughput of the apparatus, the scanning speed V is set to $V_{max}$ and at least one of the period T and the width L should be adjusted. Also, when attaching importance to imaging characteristics (distortion or the like) of the projection optical system, the width L is set to an optimum width capable of obtaining optimum imaging characteristics and at least one of the period T and the scanning speed V should be adjusted.

However, in this embodiment, actually, there is a danger of occurring unevenness of illuminance due to a positional error of the wafer stage 535. Then, if the position of the wafer stage 535 is checked prior to a light emission of the pulsed laser light source 516 and the position of the wafer stage 535 is corrected at the time of the light emission or the timing of the light emission is corrected in accordance with the positional error of the wafer stage 535, the unevenness of illuminance can be reduced much more.

Figure 25:
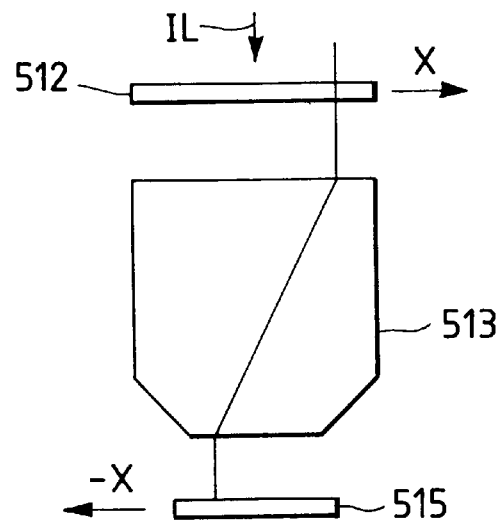
FIG. 25 shows another example of the fifth embodiment.

Next, another example of the fifth embodiment will be described with reference to FIGS. 25 and 26. In FIG. 25, the pattern image of the reticle 512 is exposed by the laser beam IL on the wafer 515 via a projection optical system 513 formed of refracting elements only. The pulsed laser light IL illuminates a rectangular area on the reticle 512 and the reticle 512 is scanned in the X direction at the constant speed V. When the magnification of the projection optical system 513 is β, the wafer 515 is scanned in the –X direction at the speed β·V in synchronism with the scanning of the reticle 512.

Figure 26:
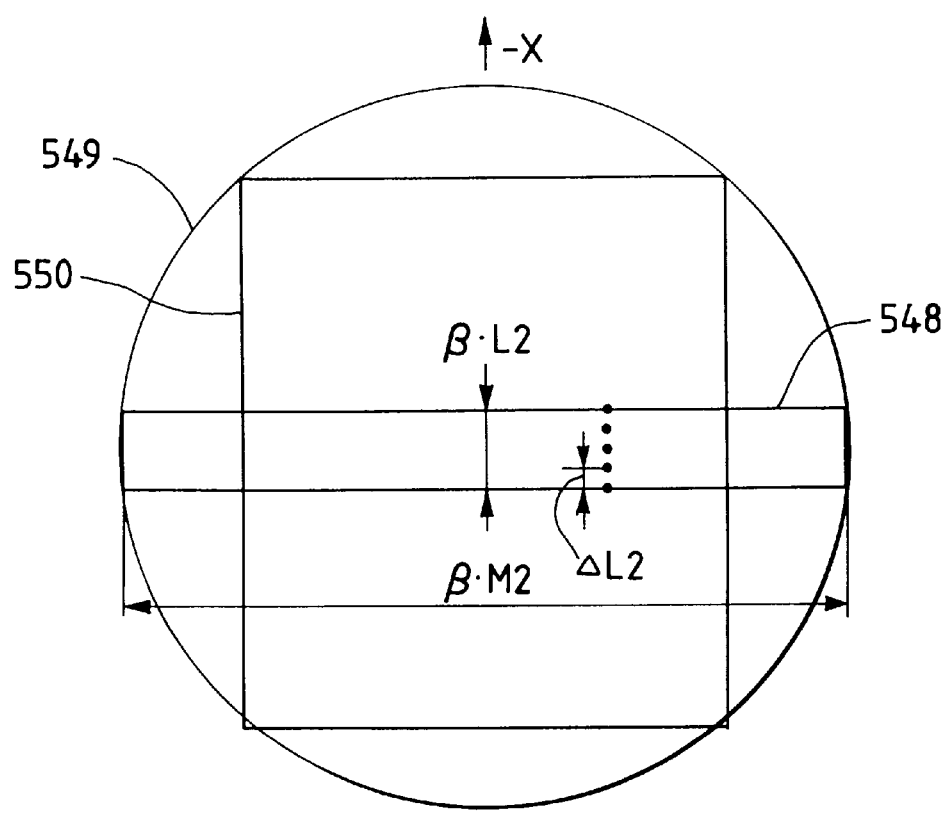
FIG. 26 shows the rectangular projection area of the reticle pattern on the wafer in FIG. 25.

FIG. 26 shows a rectangular exposure area 548 on the wafer 515 of FIG. 25. The pattern of the reticle 512 is projected to the exposure area 548. The width of the exposure area 548 in the scanning direction (X direction) is β·L2 and the width of that in the longitudinal direction is β·M2 (M2>L2). When a circular area 549 is the maximum image field of the projection optical system 513, the width β·M2 of the exposure area 548 in the longitudinal direction is approximately equal to the diameter of the circular area 549. On the other hand, in the stepper, an exposure area 552 on the wafer 515 is approximately a square touching the circular area 549 internally. Therefore, by scanning the wafer 515 in the –X direction with respect to the rectangular area 548, it is possible to expose a larger area as compared to the stepper.

When the period of the emission of the laser beam IL is T, and the distance by which the wafer 515 is scanned in the –X direction for the period T is ΔL2, in this embodiment, the width β·L2 of the exposure area 548 in the –X direction is set as follows by use of an integer n of 1 or more.

$$\beta \cdot L2 = n \cdot \Delta L2.$$

The other structure is the same as in the fifth embodiment (FIG. 21). Thereby, n laser beams are imparted to each exposure point on the wafer 515. Therefore, in all the exposure points on the wafer 515, the illuminance of the laser beams IL becomes approximately uniform and the unevenness of the illuminance becomes minimum.

The present invention is not limited to the illustrated embodiments but various modifications thereof may be made without departing from the spirit of the invention.

What is claimed is:

1. A method for exposing a substrate with a pattern formed on a mask by applying an illumination light emitted from a light source to the mask and by moving said mask and said substrate along a predetermined direction, the method comprising:

scanning a light receiving surface of a photoelectric detector relative to the illumination light;

measuring a width of an illumination area, along said predetermined direction, of the illumination light in accordance with a photoelectric signal produced from said photoelectric detector during the scan; and exposing said substrate in accordance with the measured width.

2. A method according to claim 1, further comprising:

determining scan velocities of said mask and said substrate and an intensity of the illumination light to be applied to said substrate during the exposure in accordance with the measured width; and exposing said substrate in accordance with the determined scan velocities and the determined intensity.

3. A method according to claim 1, further comprising:

adjusting a width of the illumination area on said mask along said predetermined direction in accordance with the measured width; and exposing said substrate with the illumination light having the adjusted width.

4. A method of exposing, through a projection optical system, a substrate with a pattern formed on a mask by applying an illumination light passing through an aperture of a field stop to the mask, the method comprising:

arranging a light receiving surface of a photoelectric detector for receiving the illumination light passing through said projection optical system, at an image plane side of said projection optical system;

measuring a width of an area illuminated by the illumination light defined by said aperture, along a predetermined direction perpendicular to an optical axis of the projection optical system, based on a photoelectric signal outputted from said photoelectric detector; and synchronously moving said mask and said substrate along the predetermined direction to expose the substrate under a scanning condition determined in accordance with the measured width.

5. A method according to claim 4, further comprising: adjusting a width of said aperture based on the measured width, so as to provide an appropriate exposure amount to said substrate.

6. A method according to claim 4, further comprising: determining scan velocities of said mask and said substrate based on the measured width, so as to provide an appropriate exposure amount to said substrate by scanning.

7. A method according to claim 4, further comprising: measuring a width of said illuminated area along a second direction perpendicular to the predetermined direction based on the photoelectric signal from said photoelectric detector, and adjusting a width of said aperture based on the measured width along the second direction.

8. A method of exposing, through a projection optical system, a substrate with a pattern formed on a mask by applying a continuous-wave light to the mask and synchronously moving said mask and said substrate along a predetermined direction perpendicular to an optical axis of said projection optical system, the method comprising:

measuring a width, along said predetermined direction, of said continuous-wave light; and adjusting at least one of scan velocities of said mask and said substrate, an intensity of the continuous-wave light incident to said substrate, and a width of an area illuminated by the continuous-wave light on said substrate along the predetermined direction, in accordance with said measured width.

9. A method of exposing, through a projection optical system, a substrate with a pattern formed on a mask by applying a pulsed light to the mask and synchronously moving said mask and said substrate along a predetermined direction perpendicular to an optical axis of said projection optical system, the method comprising:

measuring a width, along said predetermined direction, of said pulsed light; and adjusting at least one of scan velocities of said mask and said substrate, an intensity of the pulsed light incident to said substrate, a width of an area illuminated by the pulsed light on said substrate along the predetermined direction, and an oscillating frequency of said pulsed light, in accordance with said measured width.

10. A method according to claim 9, further comprising: changing a width of an aperture of a field stop through which said pulsed light illuminated onto said mask passes, for adjusting the width of the area illuminated by the pulsed light on said substrate along the predetermined direction.

11. A scanning exposure method in which a substrate is exposed with a pattern formed on a mask by applying light to the mask and moving said mask and said substrate synchronously, the method comprising:

illuminating the mask with light from a field stop;

measuring a shape of an illumination area defined by the field stop on a plane in which the substrate is arranged and is moved in a scan direction for a scanning exposure; and adjusting a condition for the scanning exposure based on the measured shape.

12. A method according to claim 11, wherein said illumination area has an edge along a direction perpendicular to the scan direction of said substrate, and a position of the edge is measured to obtain the shape of the illumination area.

13. A method according to claim 11, wherein said mask is illuminated with pulsed light; and said condition includes at least one of scan velocity of said substrate, an intensity of pulsed light incident on said substrate, a width of said illumination area on said substrate in the scan direction of said substrate, and an irradiation period of pulsed light.

14. A method according to claim 11, wherein said mask is illuminated with continuous-wave light; and said condition includes at least one of scan velocity of said substrate, an intensity of continuous-wave light incident on said substrate, and a width of said illumination area on said substrate in the scan direction of said substrate.

15. A method according to claim 11, wherein said illumination area has a light intensity distribution, in the scan direction of said substrate, of which an edge portion exhibits gradually changing light intensity.

16. A scanning exposure method in which a substrate is exposed with a pattern formed on a mask by applying light to the mask and moving said mask and said substrate synchronously, the method comprising:

measuring a width of pulsed light in a movement direction of the substrate for a scanning exposure; and adjusting at least one of scan velocity of the substrate, an intensity of pulsed light incident on the substrate, a width of the incident light in the movement direction of the substrate, and an irradiation period of pulsed light in accordance with the measured width so as to set the number of light pulses to be irradiated on each point of the substrate to an integer.

17. A method according to claim 16, further comprising: adjusting said intensity of pulsed light on the substrate in accordance with said number of light pulses and a proper dose of exposure of said substrate.

18. A method according to claim 16, wherein said number of light pulses is determined based on dispersion in an intensity of pulsed light.

19. A method according to claim 16, wherein said pulsed light has a light intensity distribution, in said movement direction of the substrate, of which an edge portion exhibits gradually changing light intensity.

20. A method according to claim 19, wherein said measured width is a distance between two portions in said movement direction each corresponding to an intensity level which is approximately equal to half of a maximum level of said light intensity distribution.

21. A scanning exposure method in which an object is moved in a scan direction relative to an exposure beam to expose the object, the method comprising:

measuring information on a width, in the scan direction, of an area to which the exposure beam is directed; and determining a condition for a scanning exposure based on the measured information.

22. A scanning exposure method according to claim 21, wherein said measured information includes an edge position of the area.

23. A scanning exposure method according to claim 21, wherein said measured information includes a shape of the area.

24. A scanning exposure method according to claim 21, wherein said measured information includes a uniformity of the width of the area.

25. A scanning exposure method according to claim 21, wherein said exposure beam is emitted from a pulsed beam source, and said condition is determined to satisfy the following equation:

$$N = S/P = D \cdot f/v$$

where,

N: a number of beam pulses to be directed to each point on the object,

S: a proper exposure dose for the object,

P: an energy of the exposure beam to be directed to the object,

D: the width of the area in the scan direction, f: an oscillation frequency of the beam source, and v: a scan velocity of the object.

26. A scanning exposure method according to claim 25, wherein, in order to make a whole number of a value of S/P, the energy of the exposure beam to be directed to the object is adjusted.

27. A scanning exposure method according to claim 25, wherein, in order to make a whole number of a value of $D \cdot f/v$, the width of the area in the scan direction is adjusted.

28. A scanning exposure method according to claim 25, wherein, in order to make a whole number of a value of $D \cdot f/v$, the oscillation frequency of the beam source is adjusted.

29. A scanning exposure method according to claim 25, wherein, in order to make a whole number of a value of $D \cdot f/v$, the scan velocity of the object is adjusted.

30. A scanning exposure method according to claim 21, wherein the width of the area is measured at each of a plurality of positions which are spaced from each other in a direction perpendicular to said scan direction.

31. A scanning exposure method according to claim 21, wherein the exposure beam has an intensity distribution in the scan direction, and wherein the intensity distribution has a slope portion at an edge.

32. A scanning exposure method according to claim 21, wherein a detector is moved relative to the exposure beam, and the information on the width is obtained based on an output of the detector.

33. A scanning exposure method according to claim 32, wherein said detector serves to measure a uniformity of an intensity of said exposure beam in said area.

34. A scanning exposure method according to claim 32, wherein said detector includes an array sensor.

35. A scanning exposure method according to claim 32, wherein the exposure beam is emitted from a pulsed beam source, and wherein output of said detector is sampled in synchronization with pulse oscillation of the exposure beam by said beam source.

36. A method of manufacturing a device using a scanning exposure method as recited in claim 21.

* * * * *